Figure 1A:
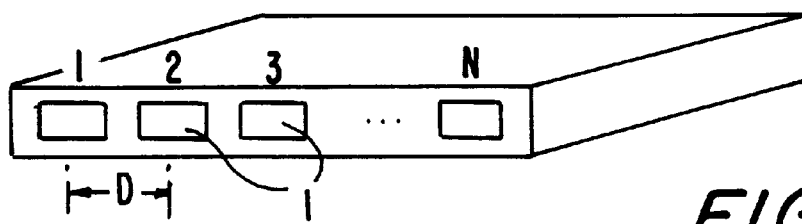

United States Patent [19]
Du et al.

[11] Patent Number: 6,160,664
[45] Date of Patent: Dec. 12, 2000

[54] PROCESS AND DEVICE FOR FORMING AND GUIDING THE RADIATION FIELD OF ONE OR SEVERAL SOLID AND/OR SEMICONDUCTOR LASERS

[75] Inventors: Keming Du, Aachen; Peter Loosen, Kornelimünster, both of Germany

[73] Assignee: Fraunhofer-Gesellschaft zur Förderung der angewandten Forschung e.V, Hanau, Germany

[21] Appl. No.: 08/930,129

[22] PCT Filed: Mar. 23, 1996

[86] PCT No.: PCT/EP96/01287

§ 371 Date: Feb. 17, 1998

§ 102(e) Date: Feb. 17, 1998

[87] PCT Pub. No.: WO96/34442

PCT Pub. Date: Oct. 31, 1996

[30] Foreign Application Priority Data

Apr. 26, 1995 [DE] Germany ............................ 195 14 626

[51] Int. Cl.[7] .................................................. G02B 27/10
[52] U.S. Cl. ............................ 359/628; 359/619; 359/618
[58] Field of Search .................... 359/619, 621, 359/622, 628

[56] References Cited

U.S. PATENT DOCUMENTS 4,986,634  1/1991  Horikawa et al. ........................ 359/618
5,877,898  3/1999  Hollemann et al. ..................... 359/619

OTHER PUBLICATIONS

W.A. Clarkson et al. "Diode Laser Bar Beam Shaping Technique", pp 410–411, 1994.

R.P. Edwin, "Stripe Stacker for use with Laser Diode Bars", pp. 222–224, Optic Letters, Jan. 15, 1995.

*Primary Examiner*—Ricky Mack
*Attorney, Agent, or Firm*—Fulbright & Jaworski, LLP

[57] ABSTRACT

A process and device for forming and guiding the radiation field or one or several solid and/or semiconductor lasers, in particular the radiation field of an array or field arrangement of one or several solid and/or semiconductor lasers, comprise radiation transformation optics with refractive elements that generate a defined radiation field. The device is characterized in that the radiation field (4) is subdivided into at least two radiation fractions according to predetermined data. Each radiation fraction enters an associated refractive element (6, 15, 19, 21, 23, 24) with predetermined co-ordinates. Each refractive element (6, 15, 19, 21, 23, 24) refracts the corresponding radiation fraction on at least one of its surfaces (7) so that the radiation fractions leave the refractive elements (6, 15, 19, 21, 23, 24) with output co-ordinates and/or propagation directions modified in relation to each other.

37 Claims, 15 Drawing Sheets

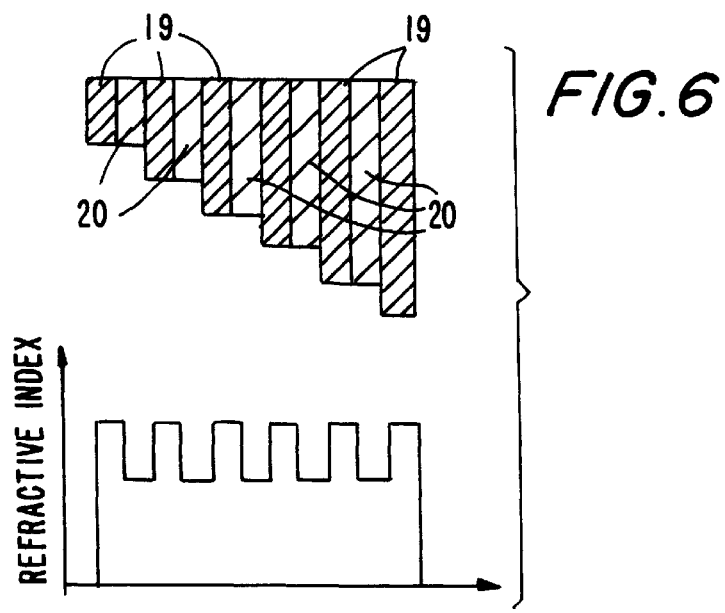
FIG.6
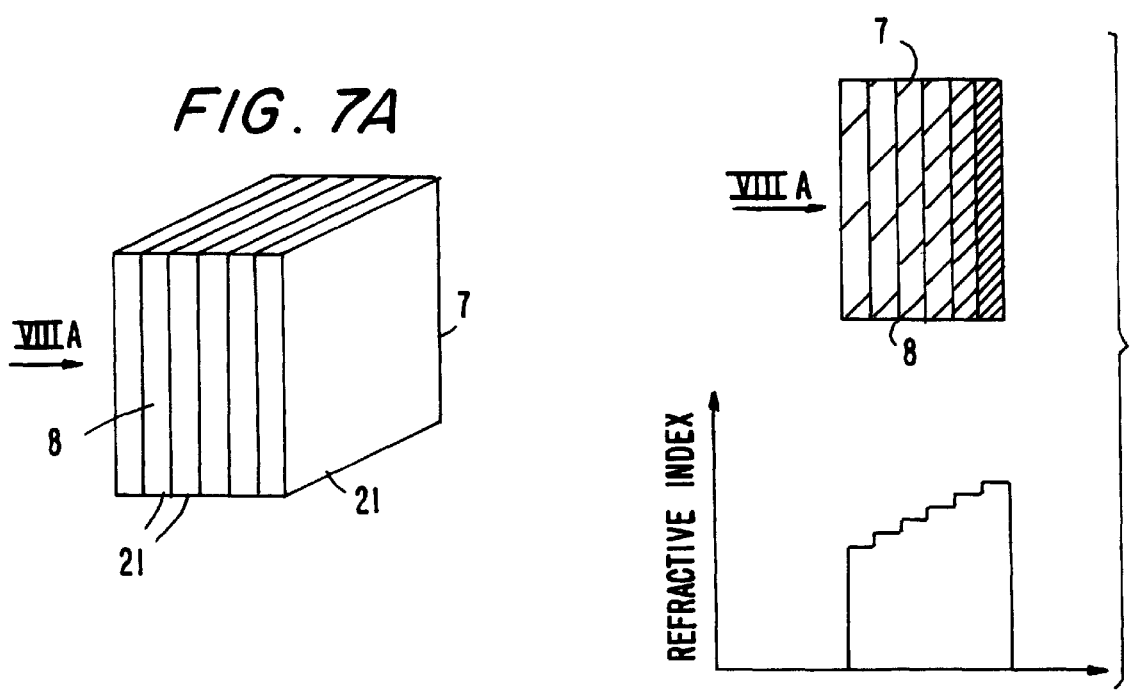
FIG. 7A
FIG. 7B

PROCESS AND DEVICE FOR FORMING AND GUIDING THE RADIATION FIELD OF ONE OR SEVERAL SOLID AND/OR SEMICONDUCTOR LASERS

The present invention relates to a system for the formation and guidance of a radiation field of one or more solid lasers or semiconductor lasers, especially a radiation field of an array or field arrangement of one or more solid lasers or semiconductor lasers, with a radiation transformation optic for producing a defined radiation field, wherein the optic has refractive elements. The invention furthermore relates to a method for forming and guiding a radiation field of one or more solid lasers or semiconductor lasers, especially a radiation field of an array or field arrangement of one or more solid and/or semiconductor lasers having a radiation transforming optic to produce a defined radiation field, the optic having refractive elements.

Solid and semiconductor lasers have in recent years found increasing use in the machining of materials and in medical technology.

One broad application of solid lasers is in the machining of materials. The range of the application of solid lasers is established by the required wavelength of the radiation produced, the power, and the shape of the lasers for the particular application. Since high beam qualities can be produced with solid lasers, especially in low-power classes, which in conjunction with short wavelengths and appropriate machining optics permit very small focal point diameters, applications of solid lasers are possible especially in the case of hard-to-machine and highly reflective materials, and in applications in which high machining precision is required. Another advantage to be mentioned is the great frequency bandwidths of solid lasers, in which many modes vibrate simultaneously, in contrast for example to gas lasers. An additional feature of a solid laser is its small size, typically about 8 cm long with a typical diameter of 1 cm. Applications of solid lasers in the field of metal machining include material ablation, boring, cutting, seaming and welding.

In recent years diode lasers have experienced rapid development. Typical applications are the machining of materials as well as the pumping of solid-state lasers.

High-power laser diodes typically possess active media with a cross section of 1 $\mu m \times 100$ $\mu m$. On account of the geometry of the active medium, the radiation which is yielded by the diode lasers is characterized by an elliptical beam cross section, great divergence in the narrow direction and relatively great divergence in the broad direction known as the junction plane. In order to achieve higher power densities with diode lasers it is common to combine several laser diodes into laser diode fields or arrays and focus their radiation. For the production of radiation fields, laser diodes, if they are arranged in a row, are disposed with the long axis of their elliptical beam cross sections running parallel to one another. Since the beam quality in the narrow direction is limited by diffraction and is about 1,000 times more limited by diffraction in the junction plane, the radiation emitted by a laser diode array cannot be focused to a small, circular spot with cylindrical optics and spherical optics or a combination thereof, which limits its application to, for example, the injection of the radiation into an optical fiber or to the so-called "end-on pumping" of solid lasers in conjunction with a laser diode array.

Even in the above-mentioned solid lasers, especially those of a low-power class using their high radiation qualities, it is also necessary, in order to produce expanded radiation fields with a high power density, to combine several such solid lasers into arrays or fields.

A problem which occurs in the case of large field arrays of solid lasers and diode lasers is the removal of the heat formed by lasing, which then requires appropriate cooling measures, so that spaces must be left between the individual solid lasers or active media, in order to provide heat sinks or build cooling channels for carrying cooling fluids. Such cooling of course greatly limits the pack density with which the lasers can be combined into laser arrays or fields.

For such radiation fields which are produced from arrays or field arrangements composed of diode lasers or solid lasers, since certain beam geometries and power densities are required in the imaging plane, i.e., on the workpiece surface for example, the radiation put out by each individual solid laser or diode laser must be appropriately guided and shaped.

On account of the extremely different beam qualities produced by such diode arrays in the two different directions, i.e., on account of the diffraction-limited beam quality in the narrow direction and the thousand times more diffraction-limited beam quality in the junction plane, the radiation emitted by a laser diode array cannot be focused with cylindrical optics and spherical optics or a combination of such optical components into a small, circular spot. Consequently at the present time the applications of high-power diode lasers are limited to areas where beam quality requirements are not strict. The expansion of the present-day applications to fields such as medical technology and machining, fiber optics and end-on pumping of solid and fiber lasers calls for the transformation of high-power diode laser radiation.

The same applies to the above-mentioned solid lasers of high beam quality whenever the large radiation fields that are required are to be produced from such individual solid lasers.

Setting out from the above-given state of the art and the problems described, the present invention is addressed to the problem of providing an apparatus and a process with which the radiation put out by diode and solid lasers, i.e., from diode laser or solid laser arrays composed of these lasers, or else the radiation that is put out by a laser, a diode bar for example (divided accordingly into radiation fractions), can be transformed by simple measures at moderate cost into radiation fields of any desired arrangement and power density distribution.

The above problem is solved in a system for the formation and guidance of a radiation field of the kind described above by grouping the radiation field into at least two fractions according to a plan, that each radiation group enters a refractive element with given coordinates, each refractive element refracting the particular radiation group at least at one of its surfaces, such that the radiation groups exit from the refractive elements with exit coordinates and/or exit propagation directions that are altered relative to one another.

Process-wise, setting out from a process of the kind described above, the above problem is solved in that the radiation field is grouped into at least two radiation fractions according to a plan, that each radiation group formed is aimed against a first refractive element associated with it, while in each refraction element the particular radiation group is refracted at least at one of its surfaces such that the radiation fractions exiting from the first refractive elements are offset from one another in a first direction different from the direction in which they entered.

With the stated arrangement and process it is possible, by means of simple refractive elements, using a different angle of entry of the individual radiation group into the refractive element and/or working paths of different length for the individual radiation groups through the refractive element, to produce at the exit end a defined stagger, so that the radiation groups will exit with coordinates and/or directions of propagation that differ relative to one another. Although the individual diode lasers and/or solid laser, and thus their radiation cross sections, are at a specific distance apart, it is possible by these refractive measures not only to achieve a reorientation of the position of the individual radiation field at the exit end of the refractive elements, but it is possible in a simple manner to place the individual radiation fields more closely together and thus increase the power density per unit area. It can be seen that, for such a reorientation and modification of the power density distribution only a minimal number of optical components is necessary, resulting, again, in a compact structure. Moreover, it is possible by the relative position of the entry ends of the refractive elements with respect to the individual solid lasers and/or semiconductor lasers and by the area of the refractive elements transversely of the direction of propagation, to accomplish a grouping corresponding to the desired imaging and power density distribution. This means that, for example, the radiation of one or more lasers (individual radiation source) of the field array is injected, for example, into the one and/or the other refractive element, i.e., a grouping of the radiation fractions of the radiation field is performed right at the entry end of the refractive elements. The arrangement is suited for field arrays of solid lasers and/or semiconductor lasers grouped and composed in any manner, i.e., linear field arrangements or arrays, or else, for example, a field arrangement with a plurality of linear laser arrays stacked one on the other, which produce a bidimensional radiation field perpendicular to the direction of propagation.

In an embodiment of the invention the radiation exiting from the refractive elements is grouped and enters a second refractive element associated with it. This grouping can be a modification of the first grouping, by which the individual radiation fractions enter into the first refractive elements, or else the original grouping can be retained, i.e., with each first refractive element a second refractive element is associated, into which those radiation portions enter which also have been brought through the first refractive element. In the second refractive element the particular radiation group is then so refracted that the radiation group exits from the further refractive elements with coordinates and/or propagation directions different from their entry coordinates. This means that, at the exit end of the second refractive elements, the exiting radiation groups are propagated in their relative coordinates to one another with a direction component different from the first reorientation. In other words, the radiation that is put out by a field arrangement composed of individual lasers is first injected into the refractive elements with an expansion perpendicular to the beam's propagation direction, i.e., in the x-y direction, such that the individual radiation groups are differently refracted such that at first an offset is achieved after the first refractive element in the one direction of propagation, i.e., in the x direction, which is preferably perpendicular to the maximum expanse of the radiation field, so that at the outside end of the first refractive element the individual radiation groups are offset from one another in a staircase-like manner and lie side by side in this direction x. For example, while this grouping is retained, the offset radiation groups then enter into an additional refractive element at a defined angle and in a direction which has a component of direction different from the direction of incidence on the first element, so that the individual radiation groups are deflected into the refractive elements such that on the exit end they then have a different offset from that of the entry end and/or a different propagation direction in the x direction. This signifies in turn that, in an image plane, the radiation fractions offset on the exit end of the first refractive element are clustered together one over the other in a staircase pattern and form, for example, a closed radiation field. It is apparent from this example that, with a given number of individual solid lasers and/or semiconductor lasers, grouped or not grouped, using a number of first and second refractive elements corresponding to the number of the radiation groups, a reorientation and/or regrouping of the radiation fractions can be achieved in the two spatial directions perpendicular to the original direction of propagation of the radiation field. In this case a higher power effectiveness, a more compact construction using a minimum number of optical components and a high degree of freedom in the ordering and reorientation of the radiation fractions is achieved.

If it is necessary, additional imaging optics are used for the purpose of imaging the radiation put out by the individual radiation sources, even in the frame of one grouping.

To achieve offsetting at the exit end of the particular refractive element, one simple measure is to associate propagation paths of different length with the individual radiation groups in the refractive elements. This can be done through different angles of incidence of the particular radiation group on the refractive element associated with it, or else the particular refractive elements can have a different length so that the path through the element is lengthened and thus the offset on the exit side is increased.

For example, in order to achieve a radiation field built up of equal radiation groups, such as one in which one radiation group corresponds to the radiation of one or two individual laser sources, in order to achieve a uniform, stepped reorientation, the refractive elements are of such dimensions and their entry surfaces oriented relatively to the propagation direction of the particular radiation group such that directly adjacent radiation groups have equal differences in their propagation path lengths. In this manner an equal offset from one radiation group to another radiation group is achieved at the exit end of the refractive elements. In a simple embodiment, in order to obtain such a uniform offset from refractive element to refractive element, the exit surfaces of the refractive elements and/or of the additional refractive elements are offset from one another in a staircase like manner, which in turn means that the individual refractive elements have a varying length in the beam propagation direction. Furthermore, it can be advantageous to the production of a uniform offset of the particular radiation groups from one another to arrange the exit and/or entry surfaces of the refractive elements and or the additional refractive elements such that they lie in a plane running parallel to one another. Preferably, however, the entry surfaces of the refractive elements associated with the radiation groups are aligned to lie in one plane and the staircase like offset is formed at the exit end of the refractive element, since the angle of divergence is then smaller due to the refraction within the refractive elements and thus the grouping can be achieved more definitely, in contrast to the case in which the offset is located at the entry end.

Another simple way to obtain the desired offset by the different refraction of the individual radiation groups in the refractive elements is to equip at least a part of the refractive elements with different refractive indices, for example through a different kind of glass body to be used for the refractive element, or by a different doping of a glass body, preferably of quartz glass, which is characterized by high purity, as a means of increasing or decreasing the refractive index. In this case a uniform gradation can be advantageous to the production of a uniform offset of adjacent radiation groups if adjacent refractive elements have different refractive indices which preferably increase or decrease in equal proportions.

To prevent portions of the radiation of a refractive element from entering into adjacent refractive elements, the adjacent refractive elements are separated from one another by a layer which has a lower refractive index than the adjacent refractive element. Radiation fractions in a refractive element, which due to the angle of divergence of the radiation enter the marginal zone of the refractive element are then reflected to the center of the refractive element by total reflection.

As it has already been stated above, the use of the refractive elements to vary the coordinates of the entering radiation groups from one to the other and/or to vary the propagation directions, offers a very simple possibility for achieving the desired radiation fields and power densities. In order to lend an additional directional component to the radiation exiting from a refractive element, in addition to the direction in which the radiation is refracted in the refractive elements, refractive elements are advantageous in which the entry and/or exit surfaces stand perpendicular on a common plane, but on the other hand are rotated with respect to one another about axes which run parallel to one another in the plane of these surfaces. By this varying alignment of the entry and/or exit surfaces, preferably in a direction perpendicular to the direction in which the radiation is refracted, the propagation directions of the individual radiation groups and thus their coordinates are varied. Furthermore, the possibility exists of slightly curving these surfaces concavely or convexly in order to fan out the beam of the radiation groups or to focus it. Another simple way of fanning out a radiation field in a direction component is for the entry and/or exit surfaces of the refractive elements to stand perpendicular on a common plane and be rotated about axes running in the plane of these surfaces and parallel to one another. Such measures can be taken both in the case of the first refractive elements and in the case of the second refractive elements, this being applied preferably to the second refractive elements, and there preferably at the radiation exit surfaces.

As it has already been explained, one fundamental disadvantage of a field arrangement or array of individual solid lasers and/or diode lasers is their low fill factor. The fill factor is to be understood as the sum of the cross-sectional areas of the individual laser beams, for example in an exit plane in which the exit window of the individual lasers is located, with respect to the total area which is excited by the exit windows of the field arrangement. In many applications it is desired to achieve a very uniform fill factor, i.e., the area irradiated by the laser beam is to be irradiated with uniform intensity in all surface areas, in which case a measure is to be applied so that, when the cross-sectional dimensions of the radiation fractions of individual radiation groups is smaller than the width of the associated refractive element, the radiation group enters the entry surface of the refractive element at an angle of incidence other than 0°, such that approximately the entire width of the entry surface of the refractory element is illuminated. This measure is applied when the refractive element is formed by a single, coherent body.

In order to produce either uniform radiation fields with a relatively great expanse, or to obtain a small spot of high density radiation in the plane of operation, a plurality of stripe-like radiation fields made up of individual lasers are aligned parallel to one another, so that the output radiation issues from a laser field array which is composed of a given number of linear laser arrays, wherein each linear laser array is made up of a number of individual lasers.

Whereas embodiments are explained above in which the radiation issuing from a first refractive element is fed after grouping to two refractive elements, in an alternative embodiment the radiation issuing from the refractive elements are grouped and each radiation group is directed at an associated reflective element having a reflection surface.

The individual reflection surfaces which are then associated in each case with one radiation group are offset and or tilted with respect to the other reflection surfaces, such that the individual radiation groups are radiated from the reflection surfaces with coordinates and/or propagation directions and/or orientation different from their entry coordinates. Orientation in this connection is to be understood to mean that the radiation cross section is rotated with reference to the beam axis in an image plane, by 180° for example, from the orientation it had before striking the mirror surface. Such reorientation may likewise serve to smooth out the radiation field produced from the individual lasers.

Again, in order to achieve a step-wise reorientation with a certain symmetry by means of the reflective elements, the individual reflective surfaces of each reflective element are offset from one another in the sequence of the individual radiation groups as they lie side by side.

To obtain the desired staggering by means of the individual reflection surfaces, the latter are arranged at a different spacing from the exit surfaces of the refractive elements that are associated with them. To bring the offset of the individual mirror surfaces and thus the offset of the individual radiation groups from one another in a relationship to one another, the centers of the irradiated reflection surfaces should lie on a straight line, so that also the offset and thus the individual radiation groups imaged in one plane will have a relationship offset linearly from one another. Depending on the measures that are taken when additional refractive elements are associated in the second stage with the first refractive elements, in the case of the latter and subordinated reflective elements, the changes in the spacing of each adjacent reflection surface are made all equal. To be able especially to construct radiation fields which are produced by laser field arrays composed of individual diode lasers and which will be able to have a high packing density in a relatively small space, the individual reflection surfaces are formed by a staircase-like mirror which can be made by simple manufacturing processes despite their small dimensions, for example by milling the staircase surfaces or mirror surfaces into a mirror body.

The individual reflection surfaces can be concave or convex for the purpose of additionally spreading out or concentrating the beam cross sections of the radiation fractions of which the radiation field is composed. Curvatures in the form of cylindrical sectors are to be preferred in order, for example, to achieve focusing in only one direction which is to be affected.

To increase the fill factor, in the case of radiation groups in which the cross-sectional dimensions of their radiation fractions is smaller than the width of the associated reflective element, the radiation of the group to the reflection surface of the reflective element is aimed at an angle other than 0°, such that the entire width of the reflection surface of the refractive [sic] element is illuminated.

With regard to the compact construction of the device, the first refractive element associated with one radiation group and each additional refractive element are combined in a body, wherein the grouping or reorientation of the individual radiation groups is formed between the first refractive element and the second refractive element at a correspondingly configured boundary surface which establishes the transition between these two refractive elements. In this manner the desired beam guidance both in the one direction and in the other direction, and thus the variation of the direction of propagation and/or of the coordinates of the radiation groups with one another, is obtained by a single optical element. In the same manner it is possible to apply the reflective elements to the beam exit surfaces of the refractive element associated with the particular radiation group, in the form of a reflective surface, so that an arrangement is possible, also in regard to the first refractive elements with secondary reflective surfaces, which is formed of a single body.

Such arrangements of only a single body present the advantage that, after the body is made, no further adjustments of the refractive elements and/or reflective elements are necessary: only the adjustment of such a device relative to the laser field array is necessary.

In the radiation transformation according to the invention it is desirable that, after the last transforming element—if necessary, transformations can be performed with more than two elements—the radiation groups exiting from or reflected from the last element have propagation directions parallel to one another or have a common intersection.

Both refractive elements and reflective elements have their specific advantage. Refractive elements are characterized by the fact that only one body is needed in order to achieve a necessary offset between the entry and exit surfaces. Furthermore, in the case of refractive elements the orientation of the exit surface can be selected such that an additional offset of the exiting radiation fractions is achieved at these exit surfaces. Moreover, with refractive elements high densities are possible, with a definite association of the refractive elements with the radiation fractions. In addition, such refractive elements can be designed and arranged such that the radiation fractions will enter the entry surfaces at equal divergence angles so that approximately equal conditions are achieved. Lastly, an advantage is to be seen in the fact that the radiation is guided in the refractive elements and is thus subject in that area to no external undesirable influences. Reflective elements as indicated above require only one mirror or reflective surface, which can be applied to support bodies that are easy to make, such as plastic, for example. And precisely with regard to such plastic bodies, which can be manufactured by injection molding techniques for example, the result is a very low-cost device.

To better explain the advantages available by the measures set forth in the individual claims, and point out additional features of the invention, a number of different embodiments will now be described in connection with the drawings.

Figure 1B:
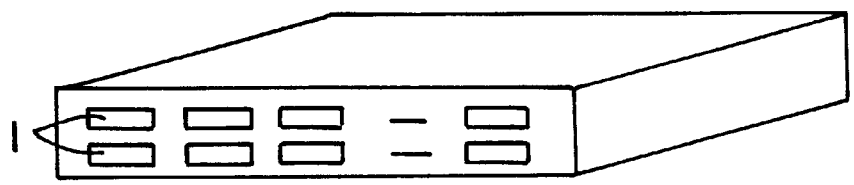
Figure 1C:
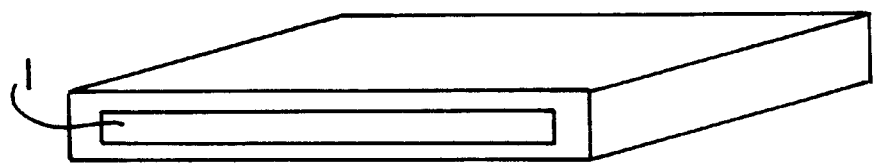
Figure 1D:
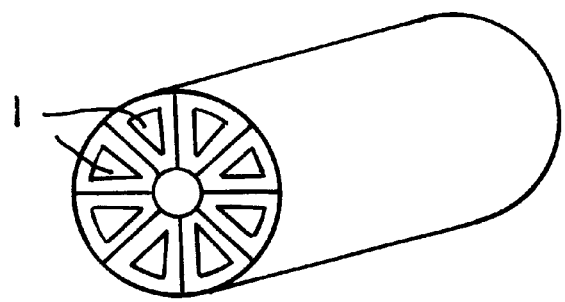
Figure 1E:
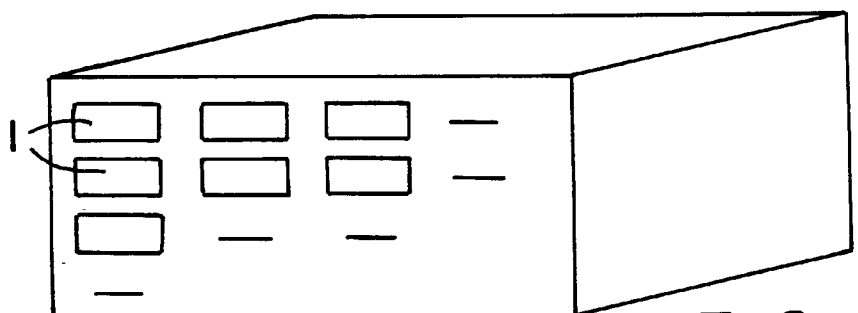
Figure 2A:
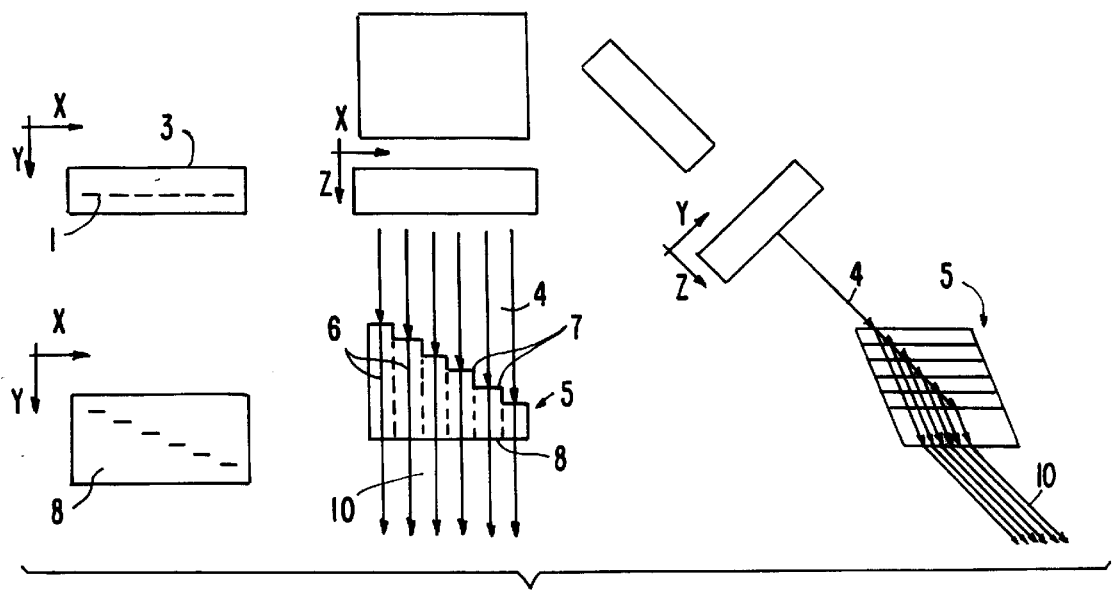
Figure 2B:
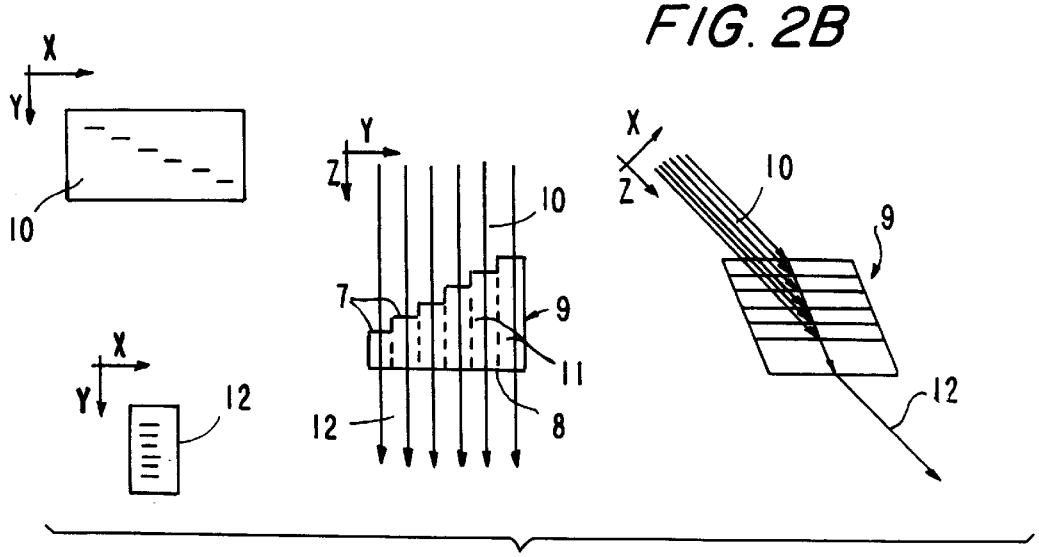
Figure 3A:
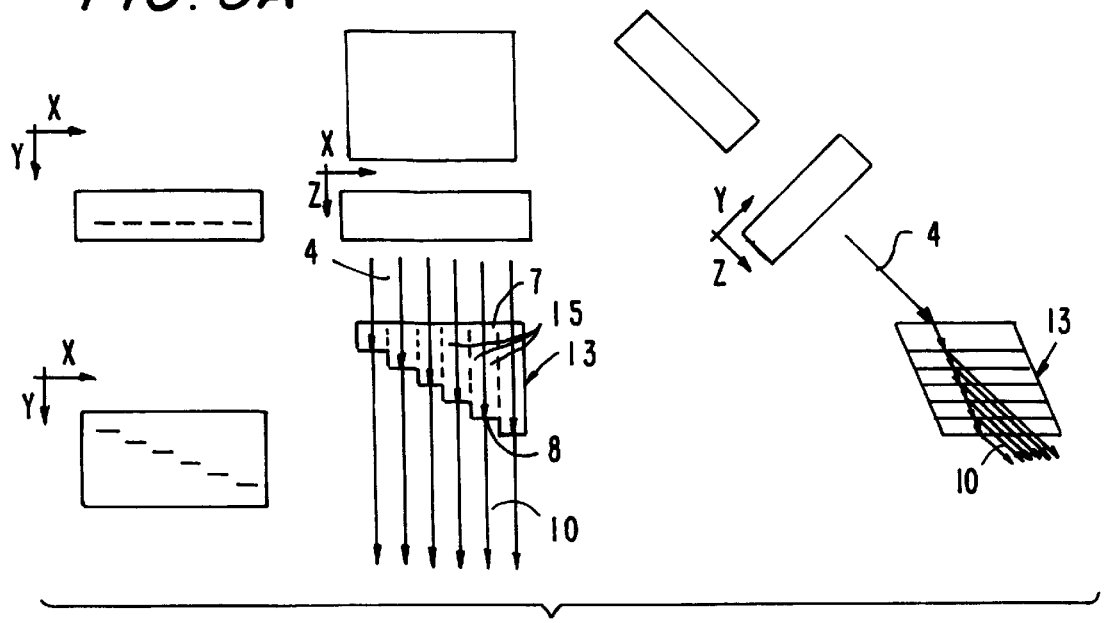
Figure 3B:
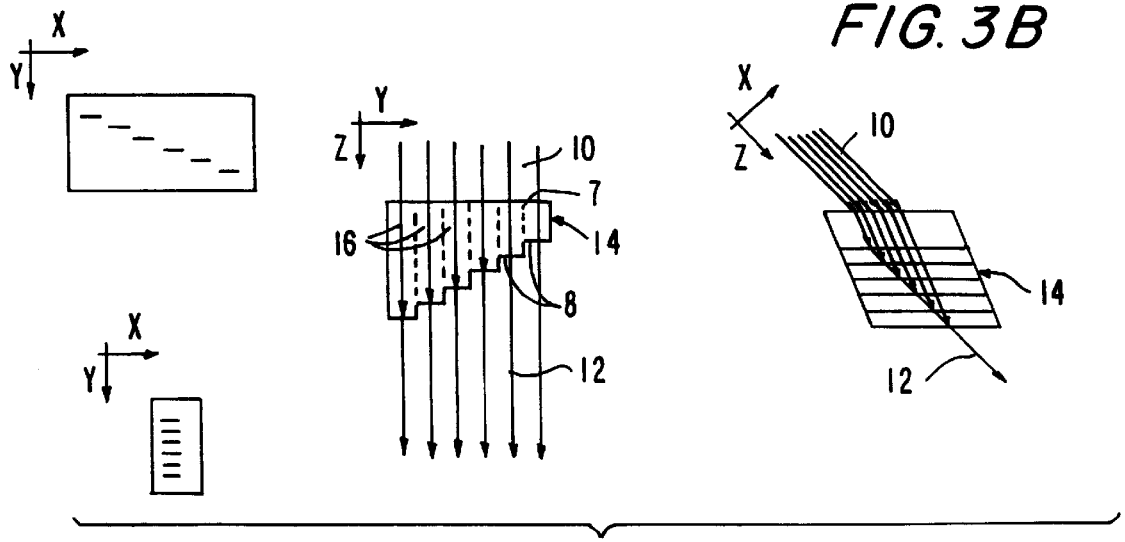
Figure 4A:
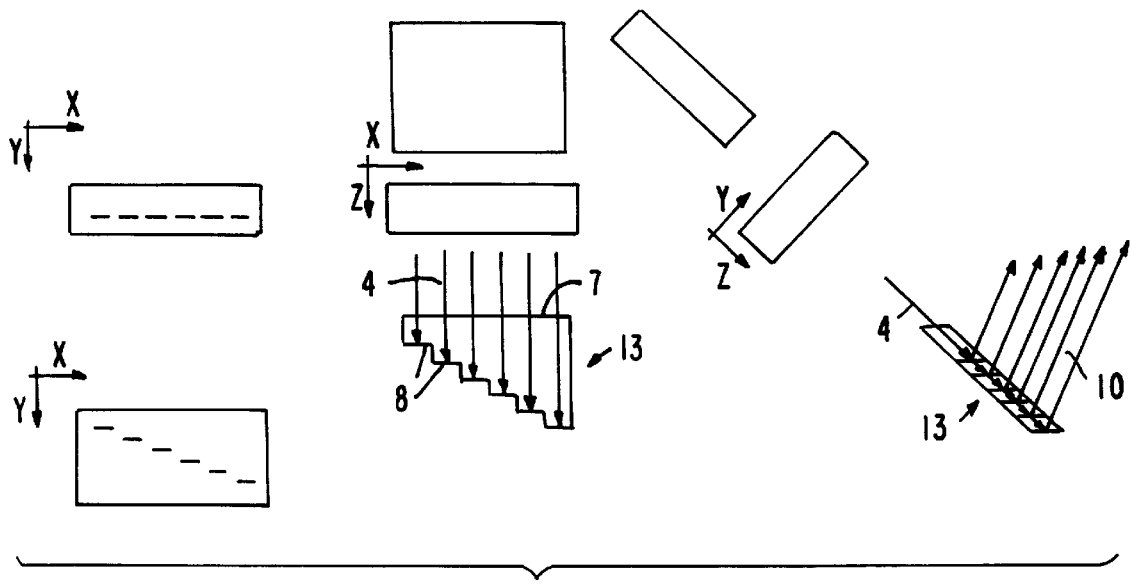
Figure 4B:
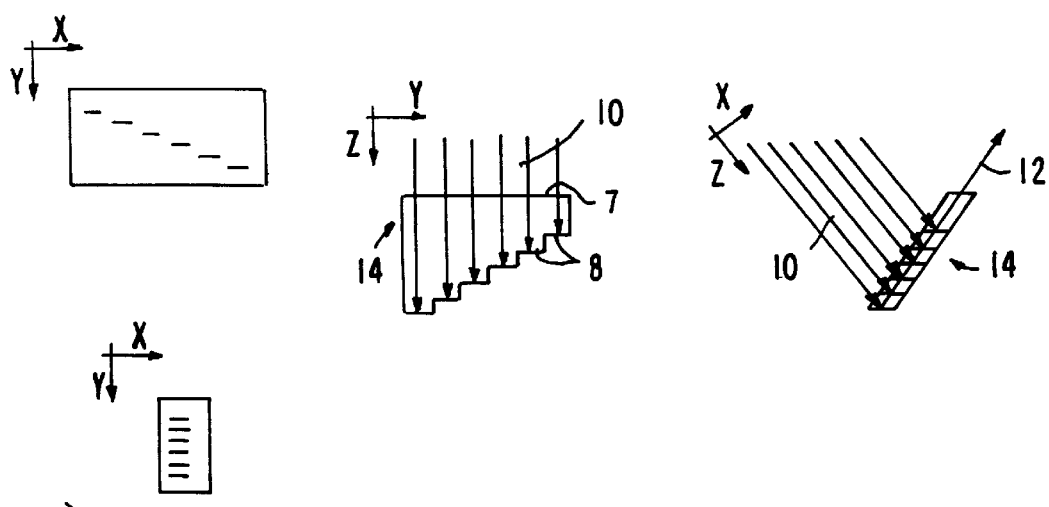
Figure 5A:
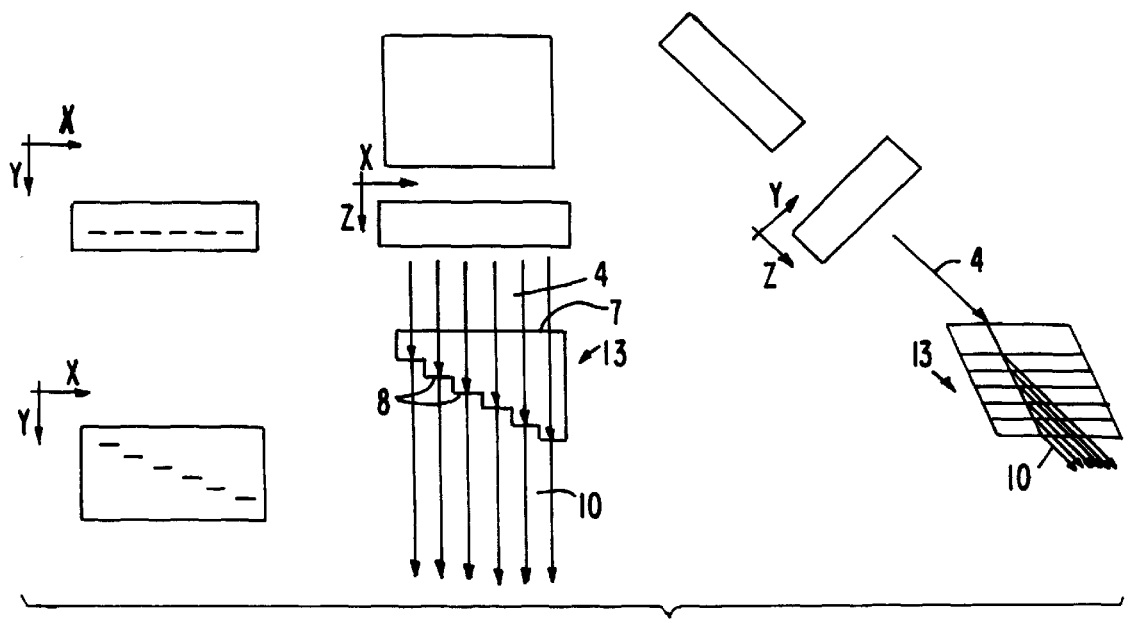
Figure 5A:
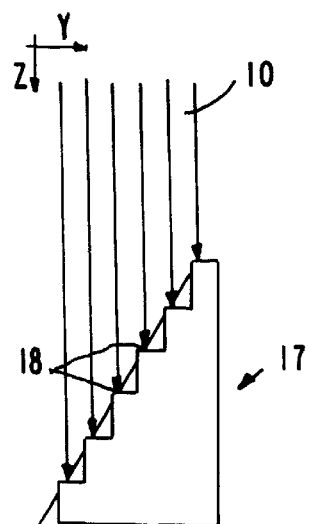
Figure 5B:
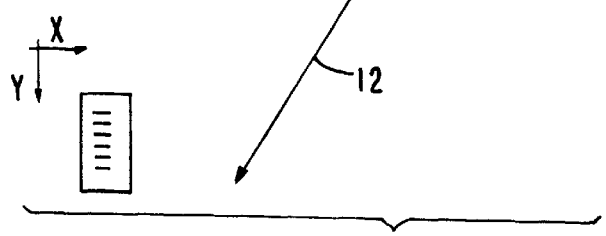
Figure 8A:
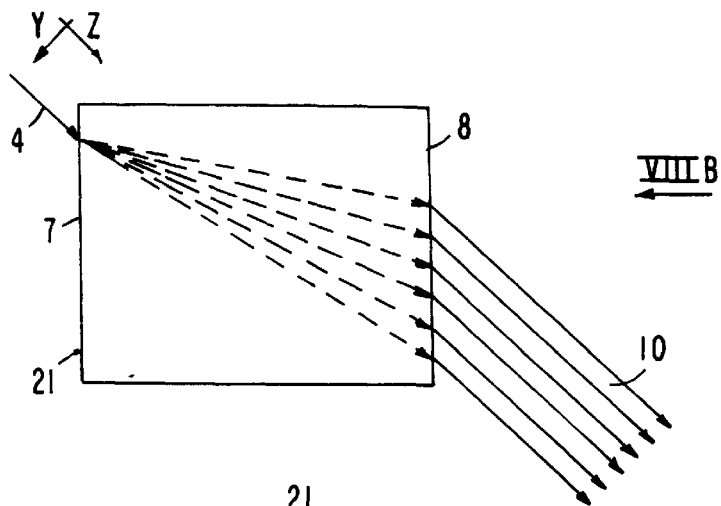
Figure 8B:
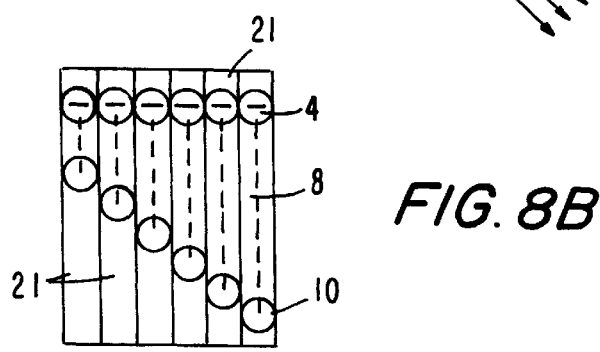
Figure 9A:
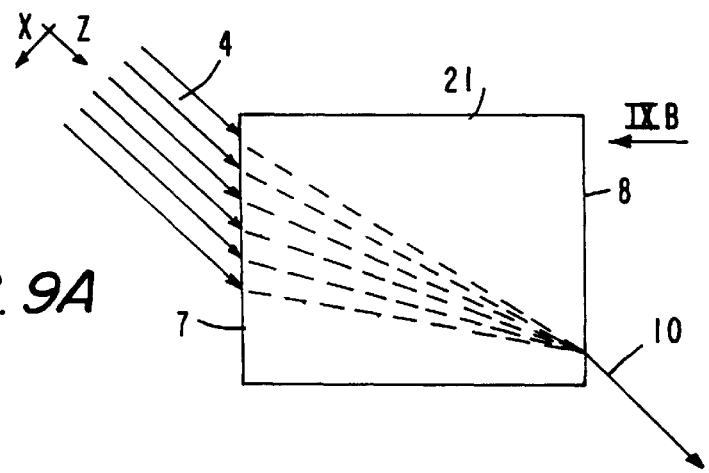
Figure 9B:
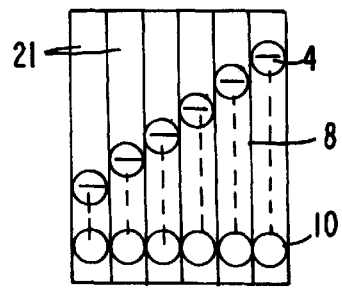
Figure 10:
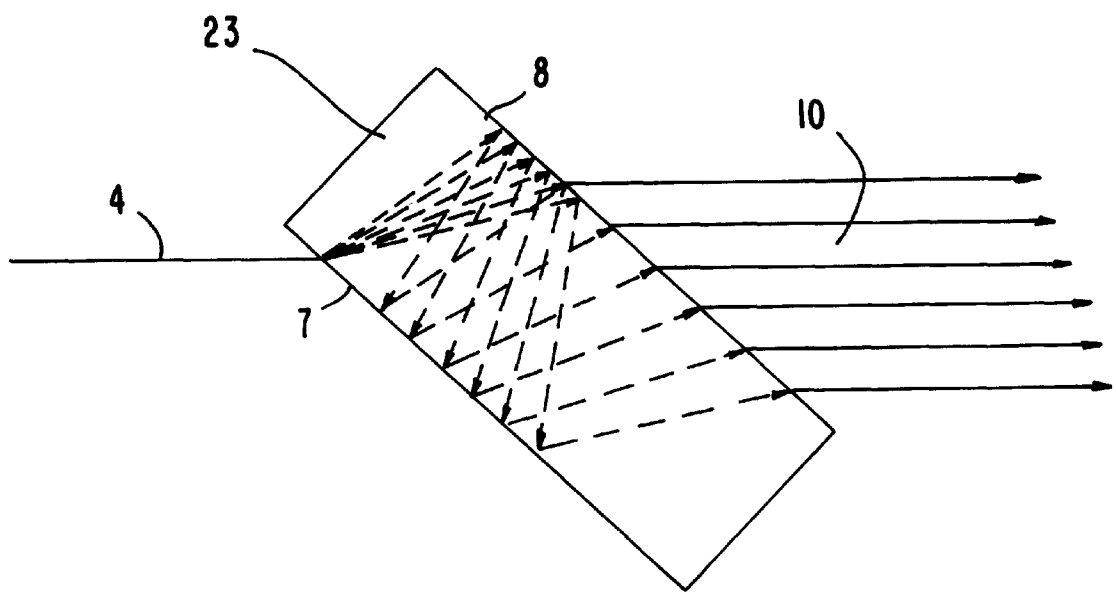
Figure 11A:
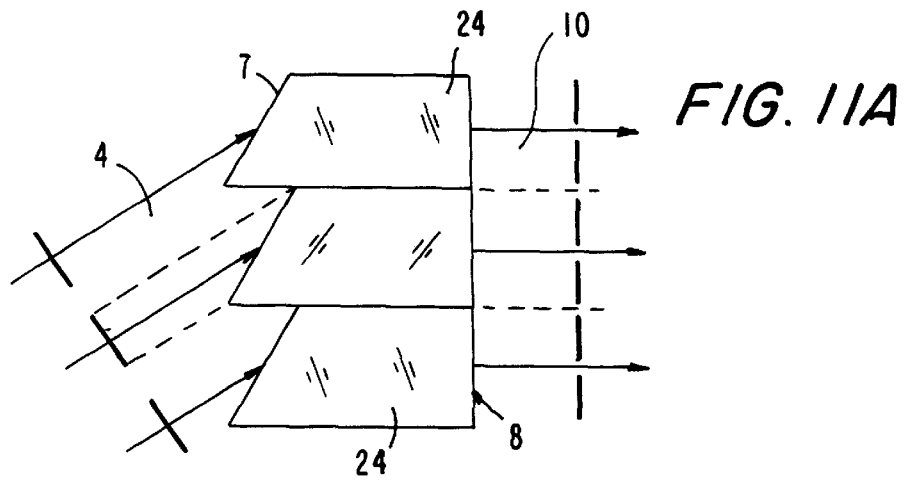
Figure 11B:
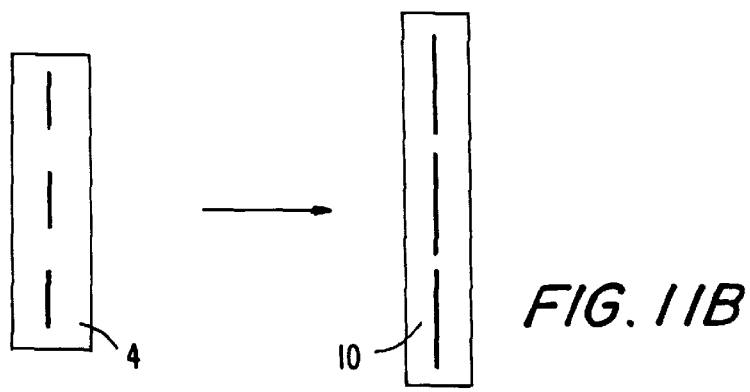
Figure 12:
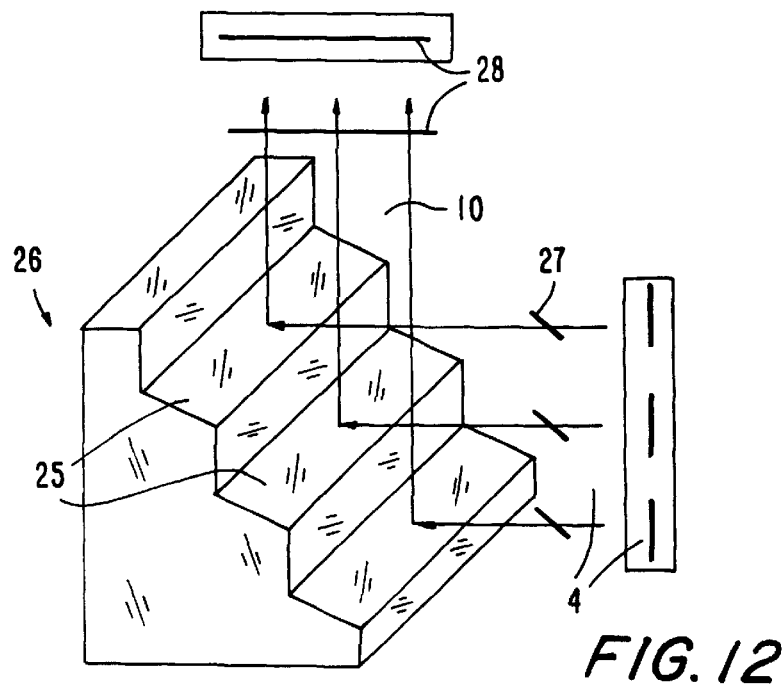
Figure 13:
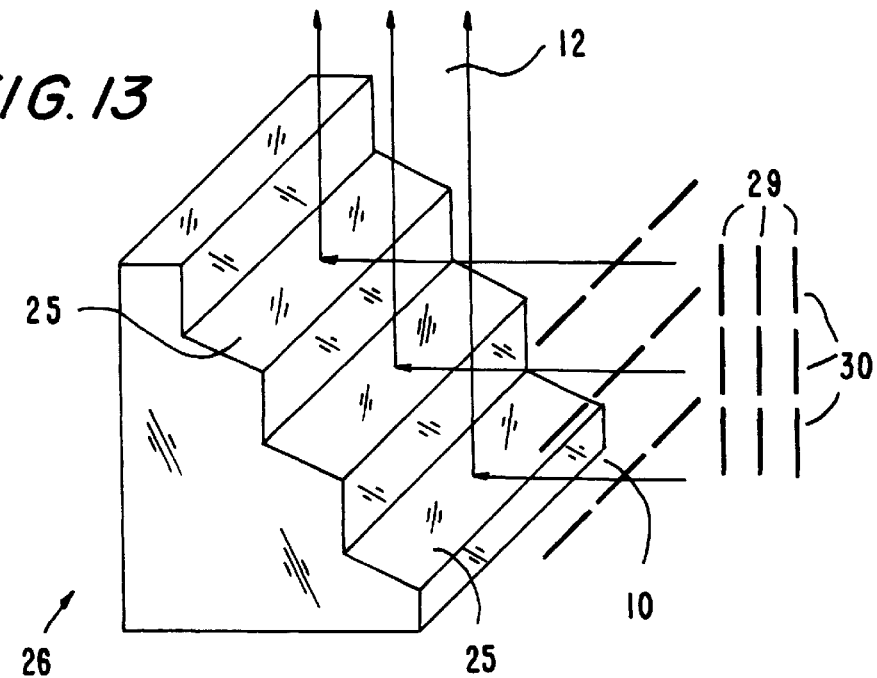
Figure 14:
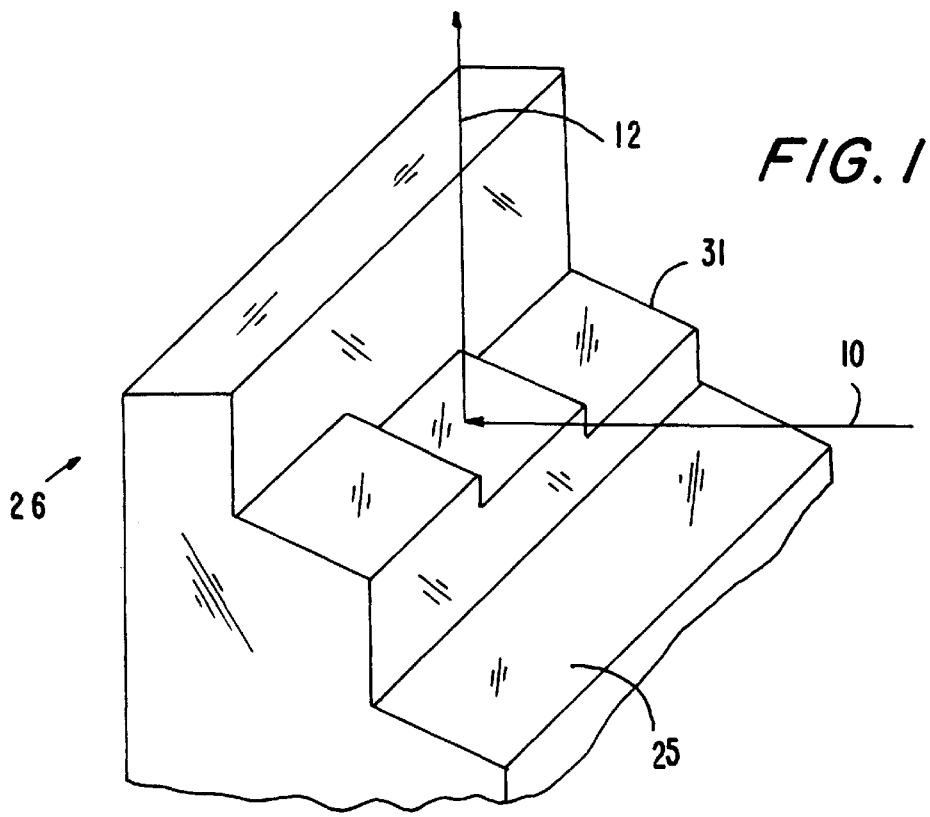
Figure 15:
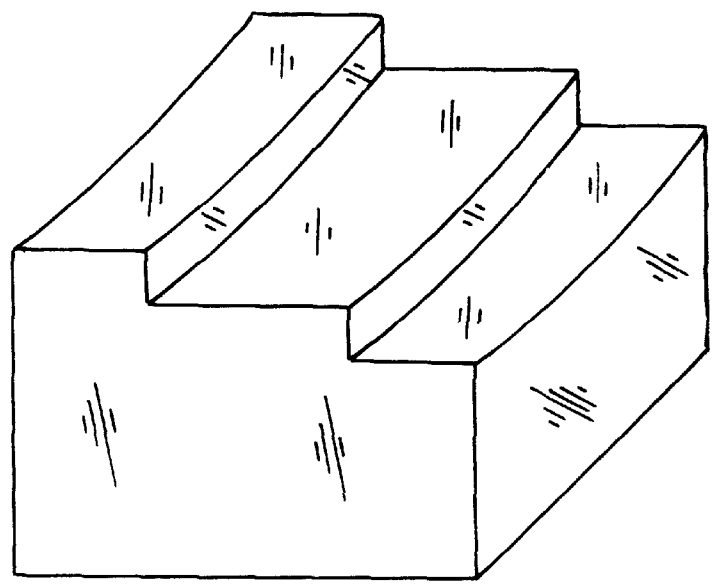
Figure 16:
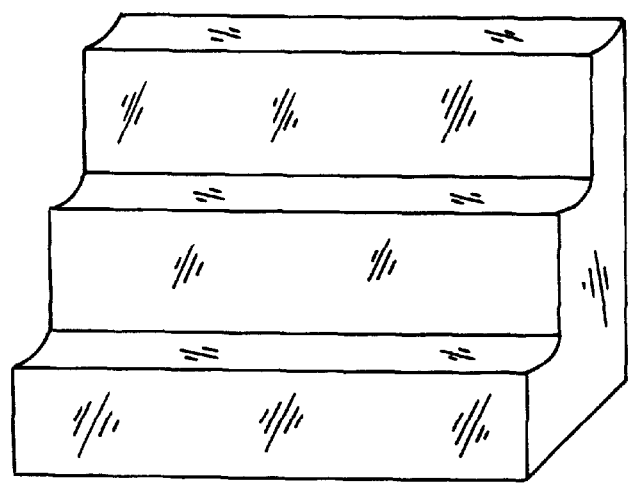
Figure 17A:
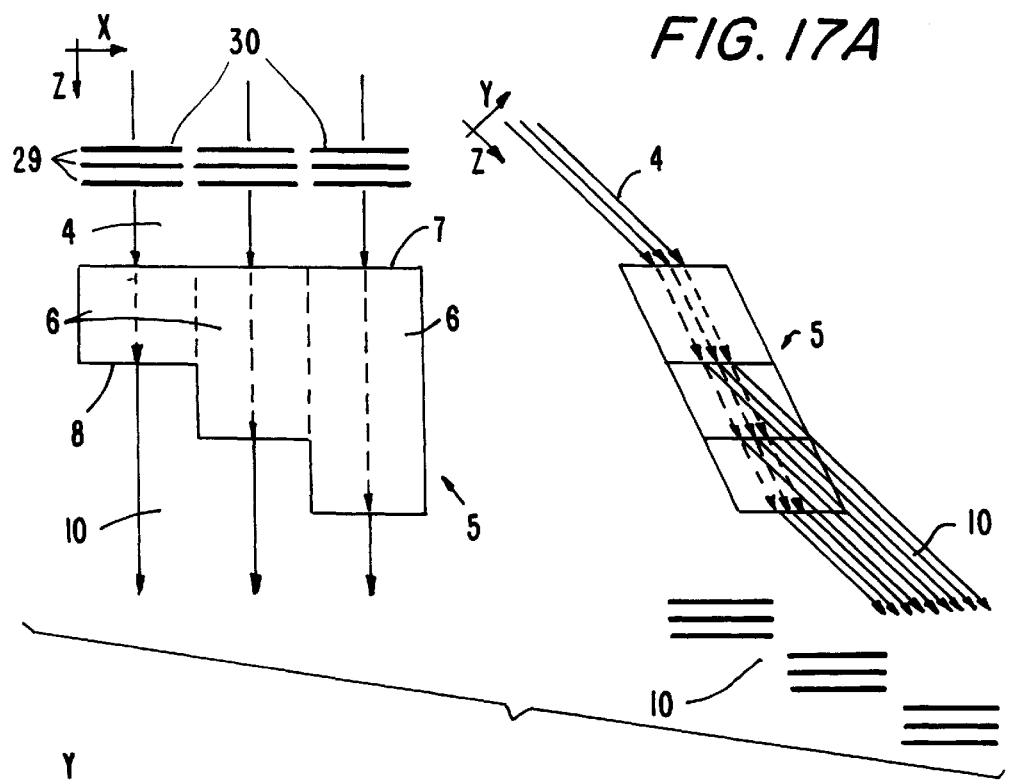
Figure 17B:
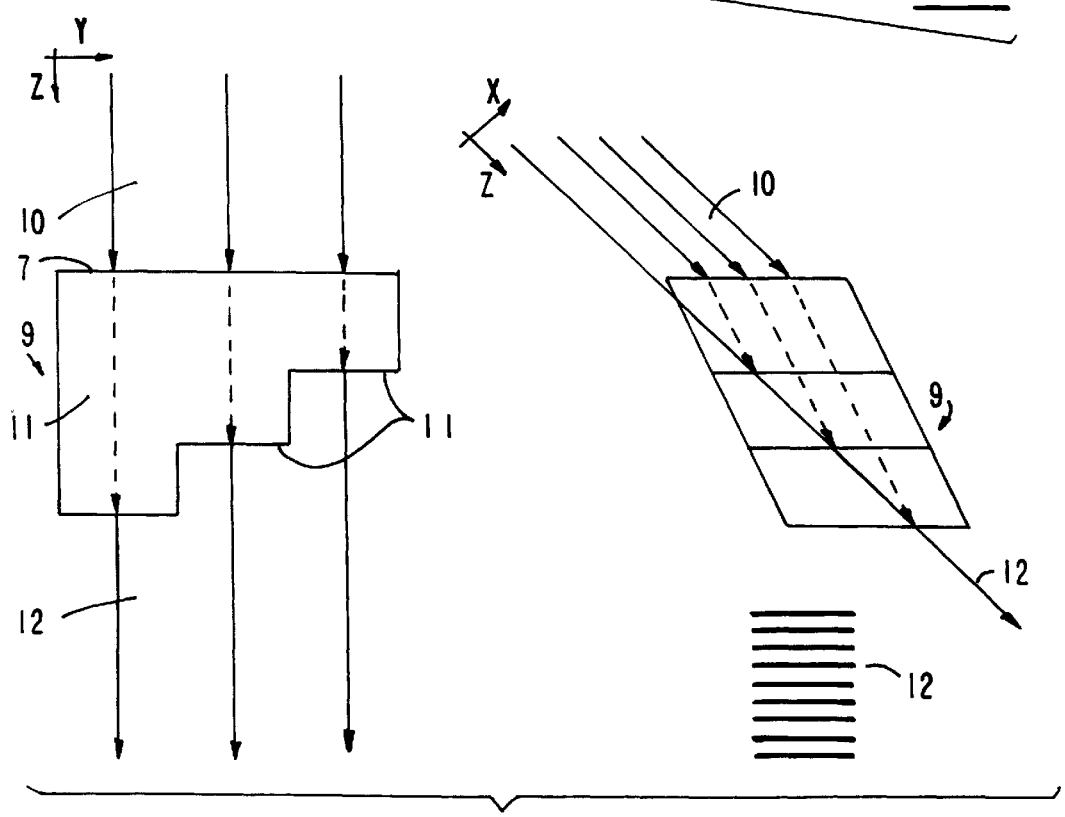
Figure 18:
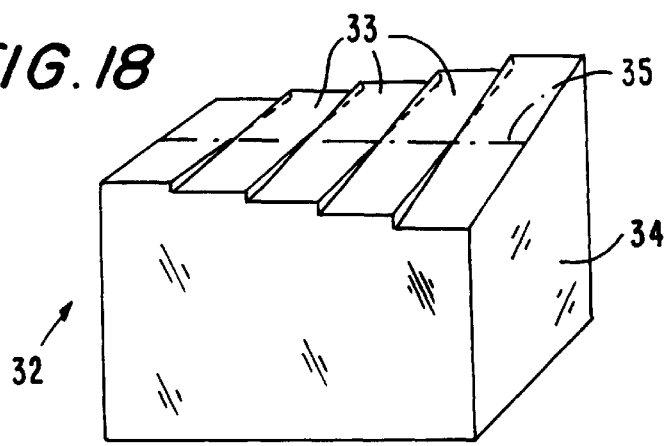
Figure 19:
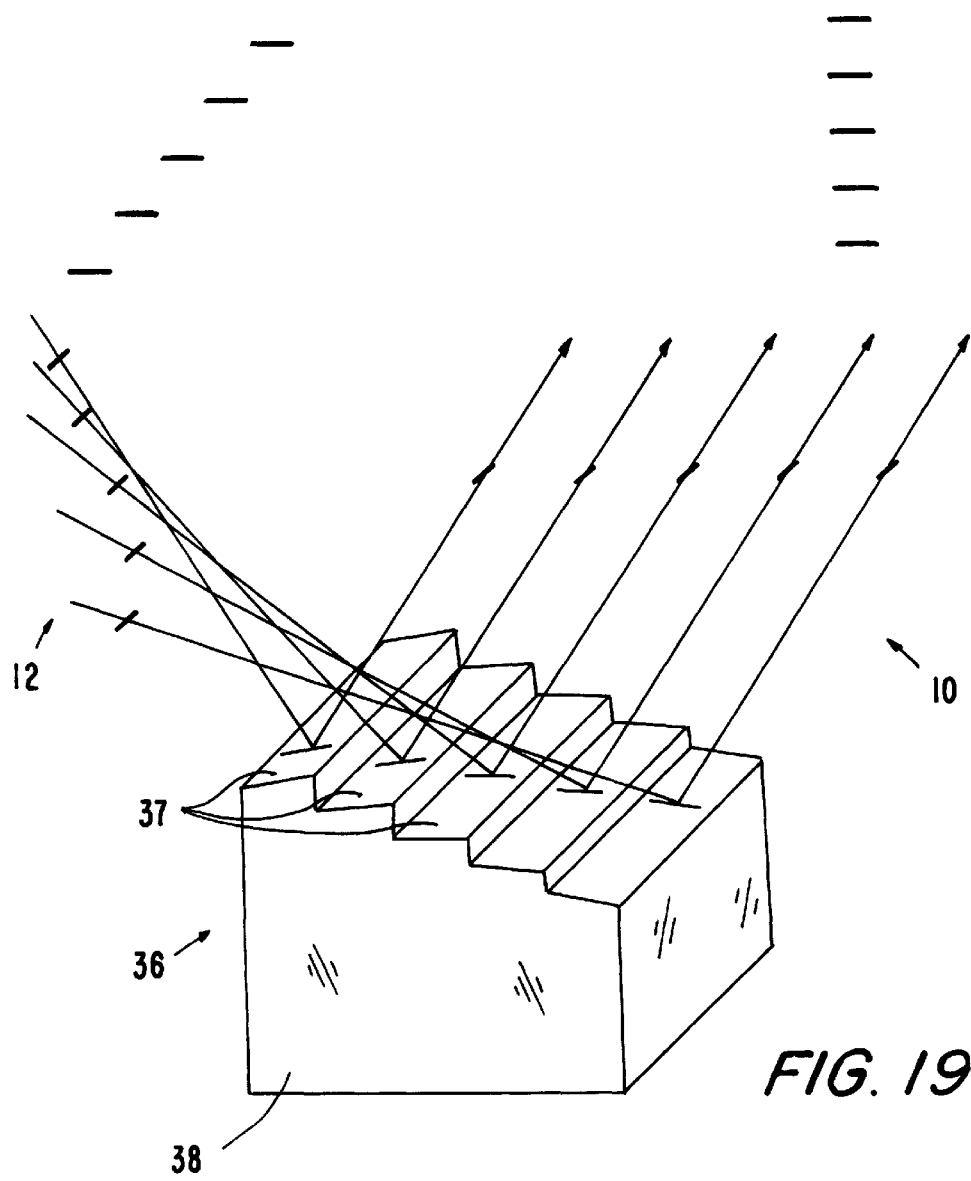
Figure 20A:
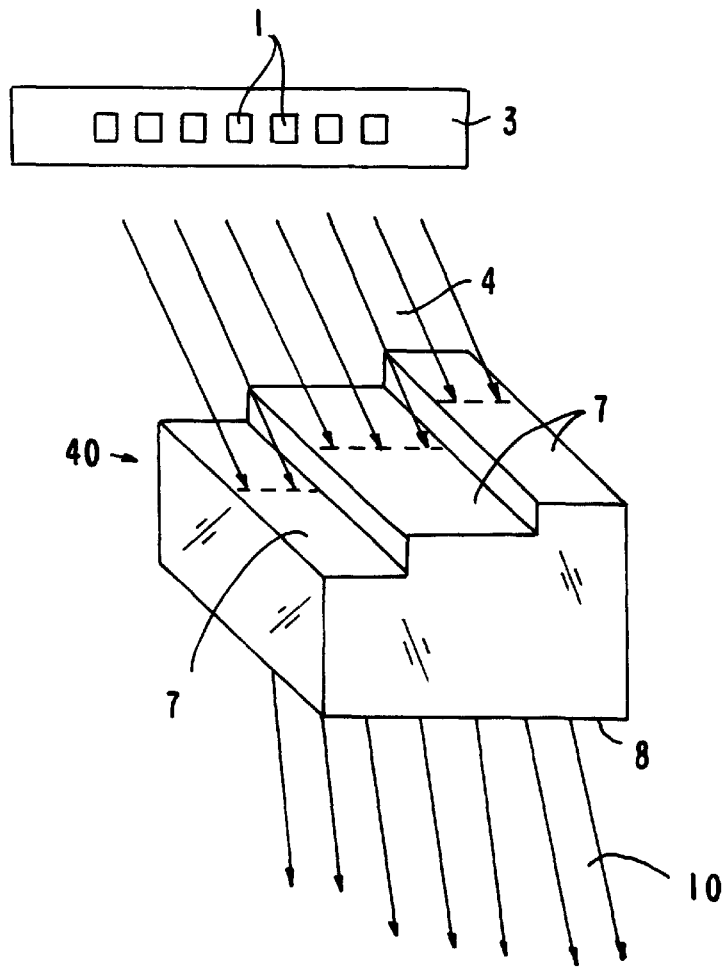
Figure 20B:
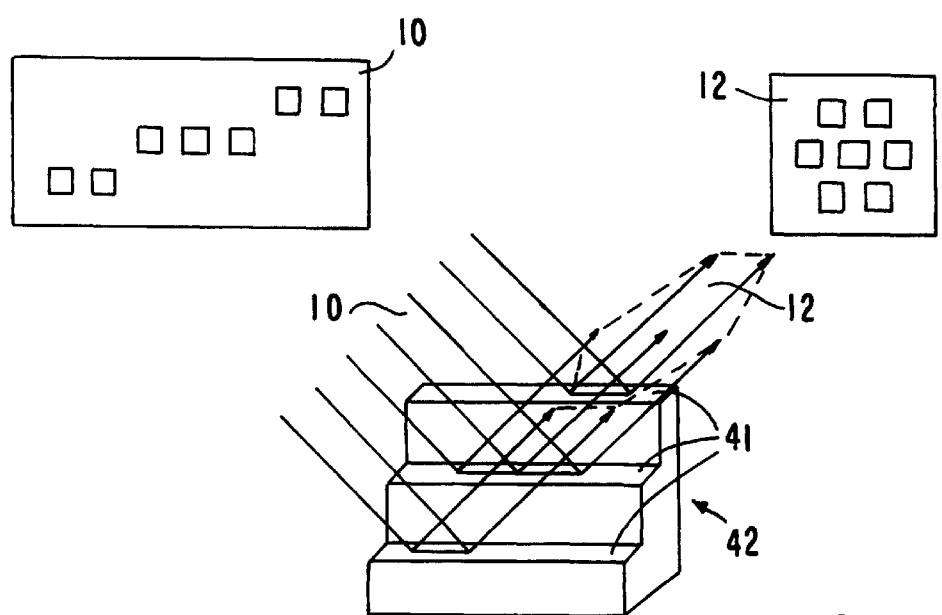
Figure 21:
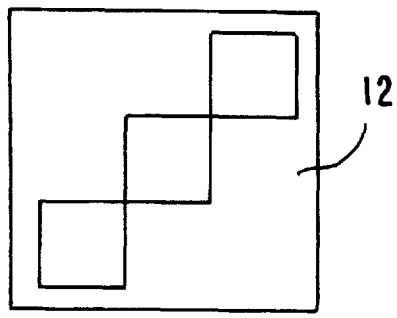
Figure 21:
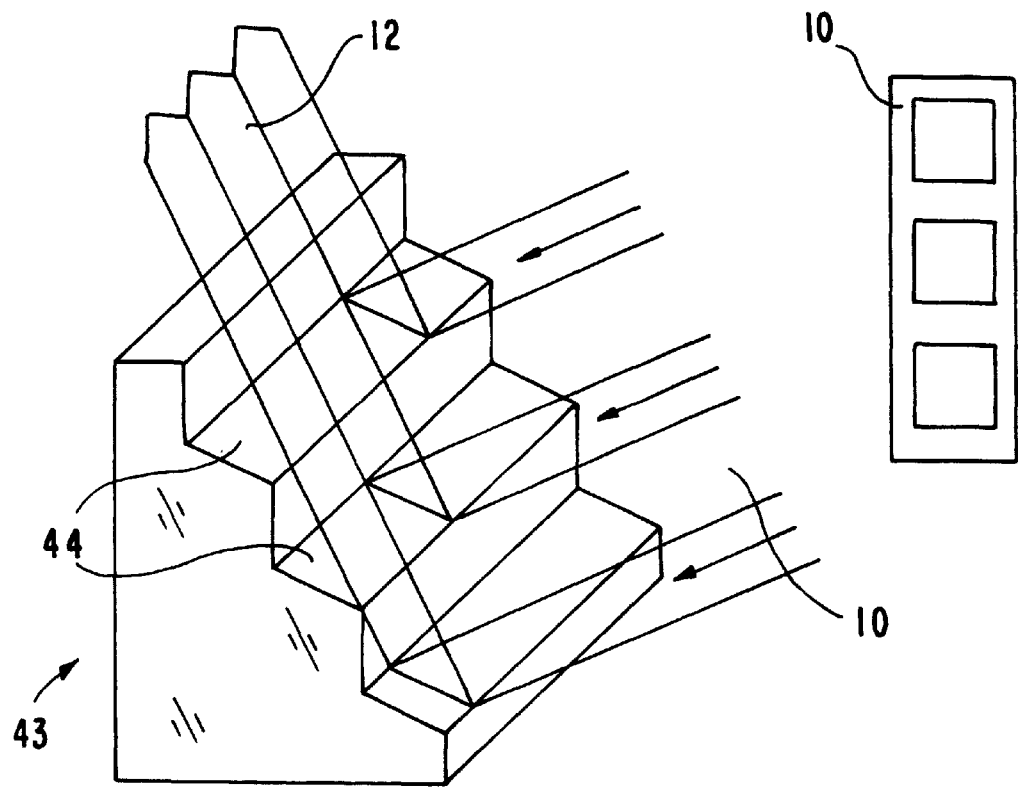

In the drawings,

| | |
|---|---|
| FIGS. 1A to 1E | show schematically a variety of unidimensional and bidimensional laser arrays, in connection with which the apparatus according to the invention can be used. |
| FIGS. 2A and 2B | show a first embodiment of the system according to the invention for the formation and guidance of a radiation field of a unidimensional, rectilinear laser array which is represented in FIGS. 1A or IB, using a refractive element (FIG. 2A) and a secondary refractive element (FIG. 2B). |
| FIGS. 3A and 3B | show a device corresponding to FIGS. 2A and 2B wherein the refractive elements, in contrast to the embodiment in FIG. 2, have on their exit end exit surfaces offset from one another in a staircase-like manner. |
| FIGS. 4A and 4B | shows an embodiment similar to that of FIGS. 3A and 2B, having additional reflective surfaces at the exit side of the refractive elements. |
| FIGS. 5A and 5B | show an arrangement using primary refractive elements (FIG. 5A) and secondary reflective elements (FIG. 5B). |
| FIG. 6 | shows a stack of refractive elements in the form of individual glass plates, while in the graph below it the refractive index is plotted across the row of the glass plates. |
| FIGS. 7A and 7B | show refractive elements which are formed by individual glass plates, wherein each glass plate has a different refractive index. |
| FIG. 8A | is a view of the arrangement of FIGS. 7A and 7B seen from the direction of the arrow VIIIA in FIGS. 7A and 7B. |
| FIG. 8B | is a top plan view of the arrangements of FIG. 8A from the direction of the view arrow VIIIB in FIG. 8A. |
| FIGS. 9A and 9B | are representations corresponding to FIGS. 8A and 8B, wherein, in contrast to FIGS. 8, the individual beams of the groups enter the refractive element at different levels and emerge from the refractive element at the same level. |
| FIG. 10 | shows schematically a lateral view of a system in which the individual groups of beams are folded repeatedly in a stack of glass plates corresponding to FIG. 7A. |
| FIG. 11A | shows an arrangement according to the invention which serves to increase the illumination density or fill factor. |
| FIG. 11B | shows schematically the cross-sectional distribution of the radiation field on the entry side and exit side of FIG. 11A. |
| FIG. 12 | is a perspective view of a staircase mirror arrangement for increasing the fill factor. |
| FIG. 13 | shows the arrangement of FIG. 13 wherein a linear laser array is associated with each staircase mirror of a linear laser array. |
| FIG. 14 | shows the arrangement according to FIG. 13, wherein a linear laser field array is associated with the individual staircase mirror elements. |
| FIGS. 15 and 16 | show each a staircase mirror with concavely curved mirror surfaces. |
| FIGS. 17A and 17B | show an arrangement with initial refractive elements (FIG. 17A) and second refractive elements (FIG. 17B), wherein the three refractive elements with which a field array of three rows with three individual lasers each is associated. |
| FIG. 18 | shows a staircase mirror in which the individual mirror surfaces are turned each by the same angle from one another about a common axis. |
| FIG. 19 | shows an additional embodiment of a staircase mirror in which the mirror surfaces have a different offset from one another and are variously inclined from one another. |
| FIGS. 20A and 20B | show a refractive element (FIG. 20A) and a reflective element (FIG. 20B) with which the radiation field of a linear laser array is grouped into three radiation fractions and formed into an approximately round radiation field, and |
| FIG. 21 | shows schematically an additional staircase mirror with another exemplary grouping of the radiation fields. |

The device according to the invention, in its various possible embodiments, is suitable for shaping and guiding the radiation field of an array or field arrangement which is composed of a plurality of solid lasers or semiconductor lasers. It is also suitable, however, for shaping a radiation field put out by a single laser, for example for the irradiation of a diode bar with an elongated radiation field which is to be rearranged or transformed.

In as much as the individual laser beam sources in the form of solid lasers and diode lasers are scalable to higher powers to only a limited extent, a larger number of individual laser beam sources are combined in various arrays or field arrangements so as to achieve higher laser powers and power densities. Several of these field arrangements are represented in FIGS. 1A to 1E.

There are linear field arrangements like those represented in FIGS. 1A and 1C, double line field arrangements like the one represented for example in FIG. 1B, radial field arrangements as represented schematically in FIG. 1D, and bidimensional arrays as represented schematically in FIG. 1E.

A linear array, such as represented in FIG. 1A, has n individual radiation sources, so that an elongated, linear beam distribution results. The linear geometry is disadvantageous in cases in which circular or quadratic radiation surfaces are to be achieved with a high fill factor in an imaging or machining plane.

The term, "fill factor," as used in this description, is to be understood as the ratio of the cross-sectional area of the individual radiation sources, provided with the reference number 1 in FIG. 1, to the total area that is excited by the individual beam sources 1.

A disadvantage of a linear array according to FIG. 1A made up of individual radiation sources is that in the longitudinal direction the beam quality is reduced by at least a factor N with respect to the individual radiation source. In a unidimensional, linear arrangement, therefore, there is a certain asymmetry of the emission of the radiation field as regards the cross-sectional geometry and the beam quality, which increases to the extent that the effort is made to increase the number of individual radiation sources and thus the total power. Bidimensional arrays corresponding to FIG. 1B, or especially arrays that are composed of more than two linear single arrays, as is represented in FIG. 1E, have the disadvantage of poor accessibility of the inner individual radiation sources in order, for example, to cool them (diode lasers) or excite them (solid lasers). In order to provide cooling and the measures necessary for excitation, the distances D (see FIG. 1A) of the individual radiation sources from one another must be increased, thereby of course reducing the fill factor at the locus of the radiation emission.

Another possibility for increasing the fill factor is afforded by an arrangement which is represented in FIG. 1D. The individual sources 1 have a circular emission cross section arranged about a central axis.

As shown by FIGS. 1A to 1E, to obtain high radiation power and high radiation densities it is not sufficient to increase the number of single radiation sources, since even a multidimensional arrangement of single radiation sources has its limits. Larger field arrangements make it necessary, for example, to provide greater distances d between the single radiation sources in order to supply the inner radiation sources 1 accordingly.

If the individual embodiments described below have identical or comparable components, these components and elements are identified by the same reference numbers and description of these parts will not be repeated, so that the description thereof in conjunction with one embodiment applies also to the other embodiment.

To be as independent as possible of the arrangement of the individual radiation sources it is thus necessary to vary the radiation of the individual radiation sources 1 by means of secondary optical arrangements in their coordinates relative to one another and/or in the direction of propagation of the individual beams relative to one another, and/or in the orientation of the individual beam such that, for a given design of a field array of a plurality of solid lasers and/or semiconductor lasers, definite radiation fields can be produced in an imaging plane.

According to a first embodiment of the invention, which is shown in FIGS. 2A and 2B, the radiation 4 issuing from a solid or semiconductor laser field array 1, which is a linear array of six individual radiation sources 1, as is represented enlarged also in FIG. 1A, is aimed at a first element 5 which is constructed of individual refractive elements 6 which are indicated by broken lines running parallel to the beam direction. The individual beams which are produced by each individual radiation source 1 can be grouped, and in accord with the design, each radiation group is directed to a first refractive element 6 associated with it. In the embodiment that is represented in FIG. 2A, with each single radiation source there is associated one refractive element 6, i.e., in this example the first element 5 is composed of six individual refractive elements 6. As shown on the right side of FIG. 2A, the individual radiation fractions 4 fall upon the end surfaces of the refractive elements 6 at an angle of incidence other than 0°, so that they are refracted within the refractive elements. Since the individual refractive elements 6 have the same index of refraction or are made of an identical, transparent material, the individual radiation fractions 4 have the same refraction angle at the radiation entry surfaces 7 of the refractive elements. By the different length of the individual refractive elements it is brought about that the individual radiation fractions travel a path of different length through the refractive element 6, so that they exit at the radiation exit surface 8 at different levels compared with the relative position on the radiation entry surface 7, as is shown at the bottom left in FIG. 2A. Due to the equal, staircase-like offset at the radiation entry surface 7, equal offsets of the radiation cross sections occurs at the radiation exit surface 8. The individual radiation fractions then pass to a second element 9, while in accord with the grouping, there is associated with each exit beam 10 issuing from the first element 5 a second reflective element, again indicated by the broken lines in FIG. 2B. The individual second refractive elements 11 have, corresponding to the first element 8, radiation entry surfaces 7 staggered in a staircase-like manner, while the radiation exit surfaces 8 lie in a common plane. Yet the gradation of the refractive elements 11 of the second element 9 are made opposite the gradation of the refractive elements 6 of the first element from the one outer radiation fraction to the other outer radiation fraction. Thus, all of the propagation paths of the individual radiation fractions are made equally long and can be imaged in a common plane.

It is in these two refractive elements 11 that the refraction occurs based on the angle of incidence of the individual exit beams 10 on the radiation entry surface 7 in a direction turned 90° from the incidence of the individual radiation fractions 4 on the first element 5. In this manner, on account of the different travel distances of the individual radiation fractions through the second refractive element 11, these radiation fractions are refracted such that the beams 12 exiting from the exit surface 8 of the second element 9 are offset from one another; thus the individual radiation cross sections are displaced one over the other, as it can be seen in the bottom left of FIG. 2B. The magnitude of the offset of the exit beams 12 at the radiation exit surface 8 can be controlled on the one hand in relation to the index of refraction of the second refractive element 11, and on the other hand through the distance traveled by the radiation fraction through its associated refractive element. As FIGS. 2A and 2B show, the radiation fractions are refracted twice by the two elements 5 and 9 and their first refractive elements 6 and their second refractive elements 11 such that they are offset variously in the one direction perpendicular to the direction of propagation, while they are shifted back over one another by the second refractive elements 11 in the direction that is both perpendicular to the direction of propagation of the radiation fractions 10 and perpendicular to the first direction of the refraction, so that the radiation cross sections, starting out from a linear arrangement, can be brought together to form a dense radiation field of high intensity.

The arrangement in FIGS. 2A and 2B has a special advantage in the shaping and guidance of a radiation field which is composed of diode lasers. Typically, in a laser field array of individual diode lasers 24, diodes are integrated over a length of 1 centimeter. Such a laser diode field array with a beam cross section of 1 μm×10 mm has extremely different beam qualities in the two different directions of its elliptical cross section. Thus, the beam quality in the narrow direction, i.e. in the junction plane, is about 1000 times refraction limited. Precisely in conjunction with a laser diode field array of this kind, in which, as shown in FIG. 2A, a refractive stage or refractive element is associated with each emitter, in the first element 5 (staircase-shaped glass bodies), lateral offsets are produced between the emitters in the y direction. The angle of incidence, the step height and the refractive index, as will be explained further on, are then adjusted to one another such that the offset between the adjacent strip emitters becomes slightly greater than the beam dimension in the y direction. Then, by the appropriate selection of the direction of incidence of the radiation on the radiation entry surface 7, and by appropriate selection of the step height in the x direction (slow direction), the second element 9, or second staircase glass body produces offsets. By the appropriate selection of the controllable factors of the first element 5, i.e., the refractive index, of the step height and of the angle of incidence, the radiation fractions are arranged with one another in the y direction. The beam quality along the y axis is then diminished by one factor of the number of emitters (in the illustrated Example 6), and at the same time the beam quality in the slow direction (x direction) by the same factor. Thus the beam qualities in the two directions become comparable and the total radiation of the diode laser field array can be focused in a circular or rectangular spot.

In FIGS. 3A and 3B a device is shown which is comparable with that of FIGS. 2A and 2B. In this embodiment of FIG. 3, the first element 13 and the second element 14 are composed of individual first and second refractive elements whose radiation entry surfaces 7 lie each in one plane, while the radiation exit surfaces 8 are staircase-like. On account of the different paths of the radiation fractions through their associated refractive elements, an offset is produced in a first direction and an offset in a second direction, so that, as in FIGS. 2A and 2B, a focal spot is produced. The embodiment of the first and second elements 13 and 14 of FIGS. 3A and 3B is to be preferred over the embodiment in FIG. 2, since due to the equal distance between the exit windows of the individual radiation sources and their entry into the radiation entry surface of the first element 13, a precise grouping can be realized.

With the aid of FIGS. 2 and 3 it becomes apparent that, depending on which radiation patterns are to be produced from the individual radiation cross sections, the staircase can also have a different pitch, such, for example, that the refractive element with the greatest length in the direction of radiation is disposed in the middle of the particular element.

Furthermore, the refractive elements are preferably made from a single glass body; another alternative embodiment, to be described below, consists in assembling the individual refractive elements from glass plates.

In FIGS. 4A and 4B there is shown an embodiment which again sets out with a linear array of six radiation sources. In contrast to the embodiments in FIGS. 3A and 3B, in this embodiment the radiation exit surfaces 8 are silvered. The result is that the radiation fractions propagating in the refractive elements impinge upon these silvered surfaces and, depending on the angle at which they exit from the element 13, they are reflected, so that they exit laterally from the element 13, as shown in FIG. 4A. While in FIG. 4A these silvered end surfaces 8 are shown in such a way that they run parallel to the entry surfaces 7, the direction of propagation of the radiation fractions 10 reflected at the end surfaces 8 give an additional, modified component of direction by means of a modified slant of these surfaces. In this matter the entering radiation 4 is transform by the different length of their propagation in the refractive elements 15 in one direction, while they are transformed with another component of direction by the silvered end surfaces 8. Like the refractive element 13 of FIG. 4A, the additional refractive element 14 of FIG. 4B, which is of the same basic construction as the refractive element 14 of the embodiment in FIG. 3B, also has silvered end surfaces 8, so that the individual radiation fractions are reflected at these end surfaces 8 and exit laterally, namely in a direction perpendicular to the direction at the exit end of the refractive element 13 of FIG. 4A, as is shown in FIG. 4B on the right-hand side, and can be seen by comparing the above-mentioned coordinates.

In FIGS. 5A and 5B there is shown another embodiment. Here the rays 10 issuing from the first refractive elements 6 (FIG. 5A), which are identical to the refractive elements 15 of the first element 13 of FIG. 3A, travel to a second element 17 (FIG. 5B) with individual reflective elements in the form of reflection surfaces 18. These reflection surfaces 18 are staggered like a staircase so that the individual beams 10 exiting from the first element 13 strike their reflection surface 18 at an angle such that they are shifted under one another and produce a coherent radiation field in one image plane as shown on the left in FIG. 5B.

As for the radiation fields produced, it is to be explained that, in order to illustrate the change in the propagation of the radiation surfaces, the individual radiation cross sections are shown with a corresponding spacing of course, the beams can be brought together such that a coherent radiation field is produced in the desired imaging plane.

In FIG. 6 an embodiment is shown schematically by way of example of the first element 13 of FIGS. 3A and 5A which is composed of individual glass plates 19 (refractive elements). Adjacent glass plates 19 are separated from one another by an additional glass plate 20 which has a lower refractive index than the glass plates 19. If the individual radiation fractions enter the glass plates 19 with the higher refractive index, they are transmitted therein and shaped in the form of a waveguide. This is especially advantageous for laser field arrays, mainly for the diode laser field arrays with a low covering density, or low fill factor, since in this way a refractive element can be associated with each individual diode laser and thus, due to the fill factor, any loss of beam quality can be largely avoided.

FIGS. 7A and 7B show devices composed of individual glass plates 21 which have equal dimensions. As it is to be seen in FIG. 7B, the individual glass plates have different indices of refraction, that of the left plate being the lowest, while that of the right-hand, outer plate 21 is the highest. The refraction indices are increased in approximately equal steps between the glass plates 21, as indicated in the diagram of FIG. 7B. In use, each glass plate 21 is associated as a refractive element with one radiation group of a radiation field. Each radiation group falls on the particular radiation entry surface 7 (these being the edge surfaces of the glass plates 21) at an angle, so that the partial beams are refracted differently according to the refractive index. This difference within the glass plates 21 is represented in FIGS. 8A and 8B. With the arrangement of the glass plates according to FIGS. 7 and 8, the radiation exit surface 8 produce a beam spread which again, as already described in the case of the earlier embodiments, is stepped or offset staircase-wise, as it can be seen in FIG. 8B.

In FIGS. 9A and 9B an arrangement of glass plates 21 corresponding to FIGS. 7 and 8A is shown in a side view. In this embodiment the entering beam 4 is staggered from one glass plate 21 to the next, and then, due to the gradated indexes of refraction, the exiting beams 10 are at the same level, as is indicated also in FIG. 9B. FIG. 9A can be considered as an annex to FIG. 8A, in which case the representation, as it can be seen from the coordinates of the entering beams 4, FIG. 9A is rotated 90° with respect to FIG. 8A, so as to show the different propagation paths in the turned direction.

With two elements composed of single glass plates 21, as represented in FIGS. 8 and 9, if the stacks of glass plates are oriented to one another at an angle other than 0°, i.e., the refractions in the glass plate stacks or the first refractive elements and the second refractive elements which are formed by these stacks of glass plates, must be in different directions, the entering radiation being transformed in two different directions.

In FIG. 10 there is shown an embodiment in a side view of another stack of glass plates, which is composed of individual glass bodies 23 with various refractive indexes. The radiation 4 falling upon a lateral surface 11 of the individual glass body 23 is repeatedly folded and exits from the exit surfaces 8 opposite the entry surfaces 7 with the stagger due to the different refractive indexes of the glass bodies 23. The two faces 7 and 8 can be suitably coated for reflection and transmission. By this repeated folding, the paths of propagation within the glass body 23 are lengthened, and thus the offsets of the issuing radiation fractions 13 from one another are increased despite the small size of the glass bodies 23.

If one considers field arrangements composed of diode laser arrays, in the form, for example, represented in FIGS. 1B and 1E, the fill factor amounts, due to heat, to about 30% to 50% of the surfaces excited by the individual beam sources. This, as already explained, reduces the beam quality compared with a theoretical case of an occupied density of 100%. To increase the fill factor and thus sustain a high beam quality, an arrangement of the refractive elements 24 is advantageous, which is represented in FIG. 11A. In this schematic example, three refractive elements 24 are stacked. In contrast to the embodiments previously described (planar refractive elements) the surfaces of entry 11 are canted. The individual radiation fractions 8 entering them are at such an angle to the radiation entry surfaces 7 that, despite the smaller size of the radiation fractions 8 across their direction of propagation, the entire radiation entry surface 7 of a particular refractive element 24 is illuminated, as indicated by the middle refractive element 24 in FIG. 11A.

In this manner a higher fill factor is produced on the side of the radiation exit surface 8 as shown more clearly in FIG. 11B. A similar system with reflective elements is represented schematically in FIG. 12. In this example the radiation fractions 4 fall at an angle on reflective surfaces 25 of a staircase mirror 26, as is indicated by the slanting lines 27 at the entering radiation fractions 4, such that, compared with the width of the particular radiation fractions, a greater area of the reflective surfaces 25 is irradiated; in this manner the relative coordinates of the individual radiation fractions 8 are altered on the exit side such that they have a fill factor of approximately 100%, as is indicated by the solid line 28 on the end of the exit beams 10. Such a measure can, for example in the embodiment represented in FIGS. 5A and 5B, be reversed in element 17 in order to increase the fill factor of the beams reflected by the mirror surfaces in comparison to the entry beams.

Whereas in FIGS. 11 and 12 the increase in the fill factor is represented only schematically, it is possible by the appropriate selection of the direction of incidence of the radiation fractions upon the entry surfaces with respect to refractive elements and by appropriate selection of the position of the reflective surfaces 25 according to FIG. 12, to alter the stagger of the exiting radiation fractions with respect to the entering radiation fractions such that a desired transformation will occur, as was explained above in connection with FIGS. 2 to 5.

Since high power densities are necessary, especially in connection with diode lasers in certain applications, and for this purpose a plurality of linear diode laser field arrays are stacked in the fast direction, in such cases the above measures for increasing the fill factor can be performed repeatedly in the fast direction.

FIG. 13 shows a schematic structure of a reflective element or staircase mirror 26 with three reflective surfaces 25 (corresponding to FIG. 12). In this case, in contrast to the embodiment as represented for example in FIG. 12, a linear field array 29 is associated with each single reflective surface 25, each linear field array being composed in this schematic representation of three single radiation sources 30, such as individual diode lasers, for example. The radiation fractions of each linear field arrangements 29 fall each on one reflective surface 25 of the staircase mirror 26 at a preselected angle of incidence, so that, on the basis of the inclination of the mirror surfaces with respect to the direction of incidence the individual linear field arrangements 29 are moved closer together, as can be seen by comparing the radiation field on the entry end and exit end of the staircase mirror 26. By this simple means the fill factor can likewise be increased, which in the embodiment represented in FIG. 13 is taken only in one direction.

In FIG. 14, the upper part of the staircase mirror 26 of FIG. 13 is represented enlarged. While the reflective surfaces 25 of the staircase mirror 26 of FIG. 13 lie in a single plane, a reflective surface in the embodiment of FIG. 14 has additional steps, for example, so that the individual radiation fractions of a linear field arrangement 29 of individual radiation sources 30 are given a corresponding offset at the exit end.

In order to focus additionally the individual radiation fractions striking the refractive or reflective elements described above, the individual radiation entry surfaces of the refractive elements, or else the mirror surfaces of the reflective elements can be concavely curved in different directions, preferably in the form of a sector of a cylinder, as shown in FIGS. 15 and 16.

Whereas different embodiments are represented above by FIGS. 2 to 4, in which an explanation was given of the radiation fractions of a linear field arrangement of single radiation sources, using first and second refractive elements, in FIGS. 17A and 17B there is shown an embodiment having a first and a second element 5 and 9, with three first refractive elements 6 and three second refractive elements 9 which are entered by the radiation fractions of three linear field arrangements 29 with three individual radiation sources 30 each. The radiation of the individual radiation sources 30 of this field arrangement is grouped with respect to each first refractive element 6 such that the individual radiation sources 30, stacked in direction z, of each linear field arrangement 29 running in direction x, are associated with one refractive element 6, and thus fall in three radiation groups on the refractive elements. In the individual refractive elements 6 these radiation groups are refracted (in the embodiment represented the refractive elements have each the same refractive index), so that, due to the different lengths of the propagation paths in the three refractive elements 6, the exit radiation 10 receives a staircase-like stagger. The individual radiation groups enter with this stagger into the second refractive elements 11, which are represented in FIG. 17B, such that the radiation is refracted in a direction perpendicular to the first refraction direction, so that at the exit end of the second refractive elements 11 the three radiation groups, and thus the nine individual radiation fractions, are shifted one under the other, as indicated by the radiation pattern in FIG. 17B.

Various embodiments have been explained above, in order either to group and rearrange the individual radiation fractions, or else to increase the fill factor of a radiation group. It is to be understood that the various ways that are explained for regrouping and increasing the fill factor can be performed in different order and in a different number of steps.

In FIG. 18 there is shown another embodiment of a staircase mirror 32 with six mirror surfaces 33, each mirror surface 33 being associated with a radiation group. The individual mirror surfaces 33 stand vertically on a plane which corresponds to the surface 34 of the staircase mirror 32, and on the other hand they are rotated away from one another, each at the same angle, about an axis 35 indicated by a broken line in FIG. 18. By this measure a duplex offset or two-fold transformation of the individual radiation fractions can be achieved between the entry end and the exit end.

Furthermore, in contrast to what is represented in FIG. 18, the individual mirror surfaces 33 can have an additional offset, such that the individual axes 35 about which the mirror surfaces are rotated from one another are separate and parallel to one another.

FIG. 19 shows an example of another staircase mirror 36 with six mirror surfaces 37, each associated with a radiation group. The individual staircase mirror surfaces 37 are standing vertically on a surface 38 which corresponds to the one lateral surface of the staircase mirror 36 in FIG. 19, yet they slope slightly away from one another at an angle across their length, while the longitudinal edges standing vertically on the surface 38 are parallel to one another. The offset between adjacent mirror surfaces 37 increases from right to left. This arrangement brings it about that, starting out from radiation groups that are spaced apart from one another and have different directions of propagation, these groups are reflected such that the radiation groups are stacked one on another in the fast direction with respect to the diode lasers and run in the same direction. This applies analogously to the solid lasers.

Another embodiment of the grouping and reorientation of a radiation field which is emitted by seven linearly arrayed, individual radiation sources, the single diodes 1, for example, is represented in FIGS. 20A and 20B. In FIG. 20A, the individual radiation fractions or groups formed corresponding to the number of the single diodes 1, fall upon a refractive body 40 having three steps of radiation entry surfaces 7. The radiation groups are so grouped and associated with these radiation entry surfaces 7 that, in each case, two of the radiation fractions of the single diodes 1 enter into the two outer radiation entry surfaces 7, while the radiation fractions of the corresponding three middle single diodes 1 of the linear field arrangement 3 enter into the middle radiation entry surface. Due to the different propagation distances of the radiation groups in the refractive body 40 the individual radiation fractions are given an offset from one another at the radiation exit surface 8, so that a radiation pattern results which is indicated on the right in FIG. 20A. With this radiation pattern, then, corresponding to the three radiation groups, three mirror surfaces 41 of a staircase mirror body 42 are associated, as shown in FIG. 20B. The individual mirror surfaces 41 are staggered such that the three radiation groups are shifted together laterally such that an approximately circular radiation field is formed by two-three-two radiation fields.

In this figure it becomes apparent that, by the deliberate reorientation of the individual radiation fields by the refractive and reflective measures, the radiation of the single diodes, or also that of a field array of single linear radiation sources, can be matched to requirements.

It should furthermore be apparent that, due to the reflections, a reorientation of the individual radiation fractions can be performed, i.e., these radiation fractions can be rotated or reflected about the axis of their direction of propagation.

FIG. 21 shows again an embodiment having a staircase mirror 43 which is comparable to the staircase mirror 26 of FIG. 12. In this example it is shown that, by inclining the individual mirror surfaces 44 so that they have a sawtooth shape, with a linear radiation field array such as the one represented on the right in FIG. 21, where the individual radiation cross sections of the individual radiation sources lie one under the other and are at a distance apart, a reorientation can be accomplished such that these radiation cross-section surfaces lie on a diagonal and are contiguous with one another, as shown in the upper left in FIG. 1. With this arrangement, the fill factor is increased at the exit end, in comparison with the entry end, but at the same time an offset is also achieved.

What is claimed is:

1. Device for the formation and guidance of a radiation field of at least one of the members of the group consisting of solid state lasers or semiconductor lasers, with a radiation transforming optic for producing a defined radiation field, the optic having refractive elements, wherein the radiation field is grouped into at least two radiation fractions according to a design, and each radiation fraction enters a respective refractive element with given coordinates, associated therewith each refractive element refracting the radiation group from at least at one of its surfaces such that the radiation fractions exit from the refractive elements with at least one of the exit parameters selected from the group consisting of the exit coordinates and the exit propagation directions altered relative to one another from their relative entry parameters.

2. Device according to claim 1, wherein the radiation exiting from the refractive elements is grouped into fractions and each radiation fraction enters an additional refractive element associated with it, each additional refractive element refracting the radiation group from at least at one of its surfaces, such that the radiation fractions exit from the refractive elements with at least one of the exit parameters selected from the group consisting of the exit coordinates and the exit propagation directions altered relative to one another from their relative entry parameters.

3. Device according to claim 1, wherein the individual radiation groups pass through propagation paths of different length in the refractive elements.

4. Device according to claim 1, wherein the exit surfaces of the refractive elements or the additional refractive elements are offset from one another in the manner of a staircase.

5. Device according to claim 1, wherein exit surfaces of the elements consisting of at least one of the group of entry surfaces of the refractive elements and the additional refractive elements lie in planes sunning parallel to one another.

6. Device according to claim 1, wherein the radiation groups enter into entry surfaces which lie in one plane.

7. Device according to claim 1, wherein at least a part of the refractive elements has refractive indexes different from one another.

8. Device according to claim 7, wherein individual adjacent refractive elements are separated from one another by a layer which has a lower refractive index than the adjacent refractive element.

9. Device according to claim 1, wherein the surfaces consist of at least one of the surfaces selected from the group of entry surfaces and exit surfaces of the individual refractive elements stand upright on a common plane and are at different angles to one another.

10. Device according to claim 1, wherein the entry surfaces consist of at least one surface from the group consisting of entry surfaces and exit surfaces of the individual refractive elements stand each upright on a common plane and are rotated from one another about axes which run parallel to one another in the plane of these surfaces.

11. Device according to claim 1, wherein in radiation groups in which the cross-sectional dimensions of their radiation fractions is smaller than the width of the associated refractive elements, the radiation group enters the entry surface of the refractive element at an incidence angle other than 0°, such that approximately the entire surface of the entry surface of the refractive element is illuminated.

12. Device according to claim 1, wherein the radiation fractions associated with the refractive elements form stripe-like radiation fields, wherein the radiation fractions of each stripe-like radiation field are aligned parallel to one another transversely of the direction of propagation of the radiation.

13. Device according to claim 12, wherein each stripe-like radiation field is formed of a like number of radiation groups.

14. Device according to claim 1, wherein the refractive elements consist of vitreous material.

15. Device according to claim 1, wherein the refractive elements consisting of at least one of the following from the group of refractive elements and the additional refractory elements each form an integral body.

16. Device according to claim 1, wherein the surfaces consist of at least one of the following surfaces selected from the group consisting of entry surfaces and exit surfaces of the refractive elements are convexly or concavely curved surfaces.

17. Device according to claim 1, wherein the radiation issuing from the refractive elements is grouped, and each radiation fraction is directed at a reflective element with a reflection surface, the reflection surfaces having an offset and/or a tilt to one another such that the radiation groups are radiated away by the reflection surfaces with coordinates and/or propagation directions and/or orientations that are changed relative to one another with respect to their entry coordinates.

18. Device according to claim 17, wherein the offset corresponds sequentially to the sequence of the radiation fractions.

19. Device according to claim 17, wherein the reflection surfaces are at a varying distance from the exit surfaces of the refractive elements with which they are associated.

20. Device according to claim 17, wherein the centers of the irradiated reflection surfaces lie on a straight line.

21. Device according to claim 17, wherein the offsets and the change in spacing of adjacent reflection surfaces are of equal magnitude.

22. Device according to claim 17, wherein the reflection surfaces are formed by a first mirror constructed in the manner of a staircase.

23. Device according to claim 1, wherein the reflection surfaces are planar surfaces.

24. Device according to claim 1, wherein reflection surfaces are convexly or concavely curved surfaces.

25. Device according to claim 17, wherein in radiation groups in which the cross-sectional dimensions of their radiation fractions are smaller than the width of their associated reflective elements, the radiation group strikes the reflection surface of the reflective element at an angle of incidence unequal to 0°, such that approximately the entire width of the reflective surface of the reflective element is illuminated.

26. Device according to claim 1, wherein the refractive element associated with a radiation group and the additional refractive element are combined in one body.

27. Device according to claim 17, wherein the reflective element associated with a radiation fraction is applied as a reflective surface to the radiation exit surface of the refractive element associated with this radiation fraction.

28. Device according to claim 1, wherein the individual reflective elements stand upright on a common plane and are at different angles to one another.

29. Device according to claim 22, having individual reflective elements which are rotated from one another about a common axis running in the plane of these surfaces.

30. Method for forming and guiding a radiation field of at least one of the members of the groups consisting of solid lasers or semiconductor lasers comprising producing a defined radiation field with a beam transformation optic, said optic having refractive elements, grouping said radiation field into at least two radiation fractions according to a design radiating each said radiation faction into a first refractive element associated therewith, refracting said radiation fraction in said first refractive element at least at one of its surfaces such that said radiation fractions exit from said first refractive elements having at least one of the exit parameters selected from the group consisting of the exit coordinates and the exit propagation directions altered relative to one another from their relative entry parameters.

31. Method according to claim 30, further comprising grouping said radiation fractions issuing from said first refractive elements and radiating each of these groups into a second refractive element associated therewith, said radiation groups being refracted in each second refractive element at least at one of its surfaces such that the radiation fractions exit from the refractive elements having at least one of the exit parameters selected from the group consisting of the exit coordinates and the exit propagation directions altered relative to one another from their relative entry parameters.

32. Method according to claim 30, wherein said radiation groups are refracted in said first refractive element in a direction which has an important direction component perpendicular to the greatest extent of the field arrangement or radiation field.

33. Method according to claim 30, comprising grouping said radiation fractions exiting from said first refractive elements and directing each of these radiation groups to an associated reflective element having a reflection surface, said radiation fractions being reflected in second directions by the reflection surfaces which are arranged in planes and are offset from one another.

34. Method according to claim 33, wherein said radiation fractions reflected in the second direction receive an offset with a direction component perpendicular to the first direction.

35. Method according to claim 30, wherein said radiation fractions are refracted in said first refractive element in a direction which has a substantial direction component perpendicular to the greatest extent of the field arrangement or radiation field.

36. Method according to claim 31, wherein said radiation fractions are transformed such that the radiation groups issuing from said second element have directions of propagation parallel to one another.

37. Method according to claim 31, wherein said radiation fractions are transformed such that the radiation groups issuing from said second element have a common intersection.

* * * * *

UNITED STATES PATENT AND TRADEMARK OFFICE
CERTIFICATE OF CORRECTION

PATENT NO. : 6,160,664
DATED : December 12, 2000
INVENTOR(S) : Du, et. al.

It is certified that error appears in the above-identified patent and that said Letters Patent is hereby corrected as shown below:

In column 17, line 17, claim 5, change "sunning" to -- running --.
In column 18, line 49, claim 30, change "faction" to -- fraction --.

Signed and Sealed this

First Day of May, 2001

Attest:

NICHOLAS P. GODICI

Attesting Officer     Acting Director of the United States Patent and Trademark Office